(12) United States Patent
Tanaka et al.

(10) Patent No.: US 8,426,846 B2
(45) Date of Patent: Apr. 23, 2013

(54) ORGANIC ELECTROLUMINESCENT ELEMENT, METHOD OF MANUFACTURING ORGANIC ELECTROLUMINESCENT ELEMENT, LIGHTING DEVICE, AND DISPLAY DEVICE

(75) Inventors: Tatsuo Tanaka, Sagamihara (JP); Hiroshi Kita, Hachioji (JP); Hiroto Itoh, Hachioji (JP); Hideo Taka, Inagi (JP)

(73) Assignee: Konica Minolta Holdings, Inc. (JP)

( * ) Notice: Subject to any disclaimer, the term of this patent is extended or adjusted under 35 U.S.C. 154(b) by 810 days.

(21) Appl. No.: 12/294,824

(22) PCT Filed: Mar. 22, 2007

(86) PCT No.: PCT/JP2007/055836
§ 371 (c)(1),
(2), (4) Date: Sep. 26, 2008

(87) PCT Pub. No.: WO2007/119473
PCT Pub. Date: Oct. 25, 2007

(65) Prior Publication Data
US 2010/0171101 A1    Jul. 8, 2010

(30) Foreign Application Priority Data
Mar. 30, 2006    (JP) .................... 2006-093431

(51) Int. Cl.
*H01L 51/54*    (2006.01)
*H01L 51/56*    (2006.01)

(52) U.S. Cl.
USPC ........ 257/40; 257/98; 257/101; 257/E51.026; 438/46; 438/82; 438/99

(58) Field of Classification Search ............. 257/40, 257/98, 101, 51.026; 438/82, 99
See application file for complete search history.

(56) References Cited

U.S. PATENT DOCUMENTS

| 6,130,001 A | 10/2000 | Shi et al. | |
|---|---|---|---|
| 2006/0081840 A1* | 4/2006 | Mori et al. | 257/40 |
| 2006/0175957 A1* | 8/2006 | Suzuri et al. | 313/504 |

FOREIGN PATENT DOCUMENTS

| EP | 1220340 A2 | 7/2002 |
|---|---|---|
| JP | 2004-103401 | 4/2004 |
| JP | 2004-103401 A | 4/2004 |
| JP | 2006-19678 | 1/2006 |
| JP | 2006-19678 A | 1/2006 |

(Continued)

OTHER PUBLICATIONS

Otsu et al., Machine Translation of JP Patent 2006-237306 A.*

(Continued)

*Primary Examiner* — Lynne Gurley
*Assistant Examiner* — Vernon P Webb
(74) *Attorney, Agent, or Firm* — Cantor Colburn LLP

(57) ABSTRACT

An objective in the present invention is to provide an organic EL element exhibiting high emission efficiency and long lifetime, together with a lighting device and a display device thereof. In the present invention, disclosed is an organic electroluminescent element comprising a support substrate provided thereon an anode and a cathode, the organic electroluminescent element comprising an organic layer containing a reactive organic compound between the anode and the cathode, wherein the reactive organic compound contained in the organic layer has nonuniform concentration at any point in time between termination of a process of preparing the organic electroluminescent element and a start of electricity application to the organic electroluminescent element.

12 Claims, 1 Drawing Sheet

FOREIGN PATENT DOCUMENTS

| | | | |
|---|---|---|---|
| JP | 2006-210125 | | 8/2006 |
| JP | 2006-210125 | A | 8/2006 |
| JP | 2006237306 | A * | 9/2006 |
| WO | 2006/129471 | | 12/2006 |
| WO | 2006129471 | A1 | 12/2006 |

OTHER PUBLICATIONS

International Search Report for International Patent Application No. PCT/JP2007/055836 mailed Jun. 26, 2007 with English Translation.

The Extended European Search Report for European Patent Application No. 07739279.3-1235/2003710 dated Jan. 3, 2012.

Hany Aziz et al., "Degradation Phenomena is Small-Molecule Organic Light-Emitting Devices", chemistry of Materials, vol. 16, No. 23, Nov. 1, 2004, pp. 4522-4532.

Michael S. Bayerl et al., "Crosslinkable hole-transport materials for preparation of multilayer organic light emitting devices by spin-coating", Macromolecular: Rapid Communications, Wiley Vch Verlag, Weinheim, DE, vol. 20, No. 4, Jan. 1, 1999, pp. 224-228.

Office Action for Japanese Patent Application No. 2008-510835, drafted Nov. 8, 2012, with English translation.

* cited by examiner

ORGANIC ELECTROLUMINESCENT ELEMENT, METHOD OF MANUFACTURING ORGANIC ELECTROLUMINESCENT ELEMENT, LIGHTING DEVICE, AND DISPLAY DEVICE

CROSS REFERENCE TO RELATED APPLICATIONS

This is a U.S. national stage of application No. PCT/JP2007/055836, filed on 22 Mar., 2007. Priority under 35 U.S.C. §119(a) and 35 U.S.C. §365(b) is claimed from Japanese Application No. 2006-093431, filed 30 Mar. 2006, the disclosure of which is also incorporated herein by reference.

TECHNICAL FIELD

The present invention relates to an organic electroluminescent element, a method of manufacturing the organic electroluminescent element, a lighting device and a display device.

BACKGROUND

Heretofore, as a light emitting type electronic display device, cited has been an electroluminescent display (ELD). Constituting elements of ELD include an inorganic electroluminescent element and an organic electroluminescent element (hereinafter referred to also as an organic EL element). An inorganic electroluminescent element has been used as a plane type light source, but high voltage with alternating current is required to drive the element.

On the other hand, the organic electroluminescent element is constituted in such a manner that an emission layer containing light emitting compounds is sandwiched between a cathode and an anode. In the above element, electrons and holes are injected into the emission layer and are subjected to recombination, whereby exciton is generated. During deactivation of the resulting exciton, light (fluorescence or phosphorescence) is emitted. Light emission can be realized via application of a voltage of approximately from several V to several tens V. Further, the organic electroluminescent element exhibits a wide viewing angle due to the self-luminescence type, and high visibility, whereby it has attracted attention in view of space saving and portability, because of a completely solid element of a thin layer type.

In the development in prospective application of organic EL elements, an organic EL element capable of efficiently producing luminescence in high luminance at low power consumption is demanded. For example, in Japanese Patent No. 3093796, disclosed is a technique to improve emission luminance and the prolonging lifetime by doping a stilbene derivative, a distyrylarylene derivative or a trisstyrylarylene derivative with a slight amount of phosphor; in Japanese Patent O.P.I. publication No. 63-264692, disclosed is an element possessing an organic emission layer in which a 8-hydroxyquinoline aluminum complex as a host compound is doped with a slight amount of phosphor; and in Japanese Patent O.P.I. publication No. 3-255190, known is an element possessing an organic emission layer in which a 8-hydroxyquinoline aluminum complex as a host compound is doped with a quinacridone type dye.

In the technologies disclosed in the above-described patent documents, it is said that the limit of externally output quantum efficiency ($\eta$ext) is 5% since the formation probability of the light emission exciton is 25% because of a formation ratio of singlet exciton to triplet exciton being 1:3 when luminescence from the singlet state exciton is used, and light-outputting efficiency is approximately 20%.

However, investigation on materials capable of emitting phosphorescence at room temperature has been accelerated by the specification described in M. A. Baldo et al., nature, vol. 403, No. 17, pages 750-753 (2000) and U.S. Pat. No. 6,097,147, since an organic El device utilizing phosphorescence emitted from the triplet state of the exciton was reported by Princeton University via the description of M. A. Baldo et al., nature, vol. 395, No. 17, pages 151-154 (1998).

Further, since in the case of an organic EL element utilizing phosphorescence, which has recently been found out, 4 times the emission efficiency are achievable in principle in comparison to an element utilizing the previous fluorescence, the research and development concerning the layer structure and electrode of a light emitting element, together with material development thereof has been done all over the world. For example, many compounds, principally heavy metal complexes such as iridium complexes, are synthesized and investigated; cf. S. Lamansky et al., J. Am. Chem. Soc., vol. 123, page 4304 (2001).

Further, an organic EL element is a completely solid element possessing an organic material film having a thickness of approximately modest 0.1 µm between electrodes, and relates to a technique expected for the next generation flat display and lighting since luminescence can also be achieved via application of a relatively low voltage of 2-20V.

However, since in an organic EL element, the emission mechanism is based on a luminous phenomenon generated by utilizing deactivation from an excited state of an organic material to a ground state, a larger band gap is desired to produce emission in the short wavelength range of blue, blue-green and so forth. Accordingly, high voltage is desired to excite the large gap.

Further, large damage is produced during returning to a ground state since the excited state itself is situated at a high level, and lifetime tends to be shortened in comparison to luminescence of green or red. The pronounced tendency is specifically seen in the case of phosphorescence generated by utilizing luminescence from a triplet excited state.

In order to solve the above-described problems, there appears various techniques, but there is, for example, a technique of producing a high-molecular weight after forming layers of structure fitted in an electroluminescent element, in which a two-functional triphenyl amine derivative having two vinyl groups in the molecule is described, and a polymer cross-linked three-dimensionally via exposure to UV light after forming the compound is formed (refer to Patent Document 1, for example). There is a technique of adding a material having at least two vinyl groups into a plurality of layers, including a method in which a polymerization reaction is conducted via exposure to UV light or heat during film formation of an organic layer before laminating a cathode (refer to Patent Document 2, for example). There is provided a manufacturing method by which AIBN (azoisobutyronitrile) as a radical generator is added into a comonomer admixture having a vinyl group similarly to a material having a vinyl group at the terminal of a phosphorescent dopant to conduct polymerization reaction during film formation (refer to Patent Document 3, for example). And, there is provided another manufacturing method via cross-linkage generated by producing Diels-Alder reaction between two molecules in the identical layer (refer to Patent Document 4, for example).

Any of the above-described techniques is a method by which the polymerization reaction is completed during or immediately after film formation (before providing a cathode), but it is still insufficient in view of durability of an organic EL element in practicality, and further technological studies to improve durability of the element is demanded.

Patent Document 1: Japanese Patent O.P.I. publication No. 5-271166

Patent Document 2: Japanese Patent O.P.I. publication No. 2001-297882

Patent Document 3: Japanese Patent O.P.I. publication No. 2003-73666

Patent Document 4: Japanese Patent O.P.I. publication No. 2003-86371

DISCLOSURE OF THE INVENTION

Problems to be Solved by the Invention

The present invention has been made on the basis of the above-described situation, and it is an object of the present invention to provide an organic EL element exhibiting high emission efficiency and long lifetime, together with a lighting device and a display device thereof.

Means to Solve the Problems

The above-described object of the present invention is accomplished by the following structures.

(Structure 1) An organic electroluminescent element comprising a support substrate provided thereon an anode and a cathode, the organic electroluminescent element comprising an organic layer containing a reactive organic compound between the anode and the cathode, wherein the reactive organic compound contained in the organic layer has nonuniform concentration at any point in time between termination of a process of preparing the organic electroluminescent element and a start of electricity application to the organic electroluminescent element.

(Structure 2) The organic electroluminescent element of Structure 1, wherein the reactive organic compound contained between one surface of the organic layer and the other surface of the organic layer has a concentration gradient.

(Structure 3) The organic electroluminescent element of Structure 1 or 2, wherein the reactive organic compound existing around a joint surface between the organic layer and a layer immediately below the organic layer has a larger amount than that of the reactive organic compound existing around another joint surface between the organic layer and another layer immediately above the organic layer.

(Structure 4) The organic electroluminescent element of any one of Structures 1-3, wherein either A1 obtained by dividing absolute value |A−B| by A or B1 obtained by dividing absolute value |A−B| by B is at least 5%, where A is an amount of the reactive organic compound existing near one surface of the organic layer, and B is an amount of the reactive organic compound existing near the other surface of the organic layer.

(Structure 5) The organic electroluminescent element of Structure 4, wherein either A1 obtained by dividing absolute value |A−B| by A or B1 obtained by dividing absolute value |A−B| by B is at least 10%.

(Structure 6) The organic electroluminescent element of any one of Structures 1-5, wherein a method of manufacturing the organic electroluminescent element comprises a coating process.

(Structure 7) The organic electroluminescent element of Structure 6, comprising two layers coated in series via the coating process.

(Structure 8) The organic electroluminescent element of Structure 6 or 7, comprising at least three layers coated in series via the coating process.

(Structure 9) The organic electroluminescent element of any one of Structures 1-8, wherein the reactive organic compound comprises one of partial structures represented by the following formulae.

(Structure 10) The organic electroluminescent element of any one of Structures 1-9, wherein the organic layer comprises a phosphorescence emitting dopant.

(Structure 11) A method of manufacturing the organic electroluminescent element of any one of Structures 1-10, comprising the step of preparing at least one organic layer with a coating process.

(Structure 12) A lighting device comprising the organic electroluminescent element of any one of Structures 1-10.

(Structure 13) A display device comprising the organic electroluminescent element of any one of Structures 1-10.

Effect of the Invention

In the present invention, provided can be an organic EL element exhibiting high emission efficiency and long lifetime, together with a lighting device and a display device thereof.

EXPLANATION OF NUMERALS

Figure 1:
FIG. 1(a)-FIG. 1(e) each show a schematic diagram of an organic EL full color display device.
Figure 1:
Figure 1:
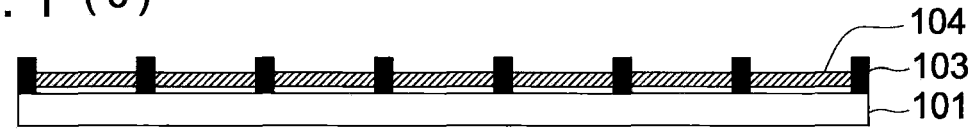
Figure 1:
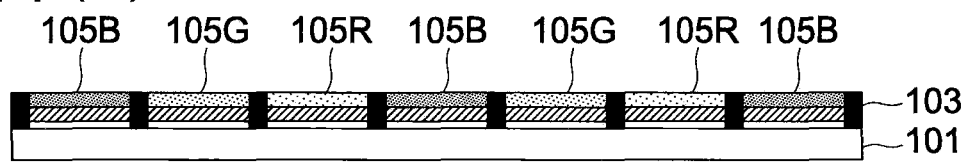
Figure 1:
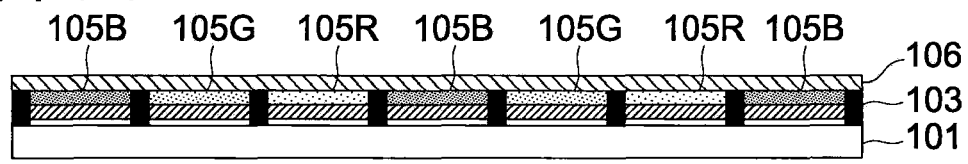

101 Glass substrate
102 ITO transparent electrode
103 Partition wall
104 Hole injection layer
105B, 105G and 105R Emission layer

DESCRIPTION OF THE PREFERRED EMBODIMENTS

As to an organic electroluminescent element (referred to also as an organic EL element) of the present invention according to any one of Structures 1-10, an organic electroluminescent element (organic EL element) exhibiting high externally output quantum efficiency and long lifetime (improved toughness) of the element was able to be obtained.

Further, a method of manufacturing the foregoing organic EL element possessing a coating process, and a high luminance display device and a lighting device each fitted with the foregoing organic EL element were successfully obtained.

Next, each of constituent parts of the present invention will be detailed in order.

<<Organic Layer Containing Reactive Organic Compound>>

An organic layer containing a reactive organic compound of the present invention will be described.

The organic EL element of the present invention possesses at least one organic layer containing a reactive organic compound, but the element may possess other organic layers as layers of structure. Further, preparation of the organic layer will be detailed later on, but usable examples of the preparation method to form layers of structure may include commonly known coating processes, an evaporation method and the like, and a mixed method including a coating process and an evaporation method.

After considerable effort during intensive studies concerning problems of conventionally known organic EL elements as described above, the inventors have found out those described below.

Herein, a step of forming an organic layer via coating is taken up as an example, and a background having led to the present invention with the inventors will be explained.

The inventors prepared an element in which a reactive organic compound (unreacted monomer, referred to also as a compound having a reactive group) was consciously left over (or remaining) in a coated layer (referred to also as a coated film) to study element performance associated with remaining of the foregoing compound.

As the result, it was to be understood that reaction proceeded by applying electricity to an element in cases where a reactive organic compound was remaining in an organic layer, and element performance could be controlled in the desired direction of the inventors.

It was specifically understood, for example, that when the reactive organic compound was an unreacted polymerizable monomer or such, it developed a polymerization reaction with active radicals or such generated during use of an element, and a network polymer caused by the organic molecule was formed to obtain an effect of producing inhibition of the element degradation via adjustment of a Tg (glass transition temperature) of layers of structure.

It was further understood that reaction accompanied with breakage or formation of the conjugated system of the molecule was possible to be adjusted employing reactive radicals during use of the element not only to change the emission wavelength of an organic EL element, but also to inhibit degradation of the specific wavelength.

As to a reactive organic compound of the present invention, all of the functional compound contained in the layers of structure constituting an organic EL element (explained later in detail) is possible to be utilized as a base nucleus of a reactive compound. For example, a host compound in the after-mentioned emission layer, an emission dopant and so forth, and a hole transport material, an electron transport material and so forth are each contained as the base nucleus, and a compound in which a reactive substitute is substituted for the base nucleus is usable.

Examples of the above-described reactive substitute include groups shown below.

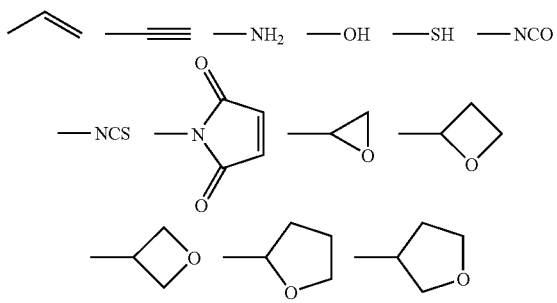

On the other hand, from a manufacturing point of view, in the case of a step of preparing a multilayer via coating, the lower layer is not preferably dissolved by a coating solution of the upper layer, and the upper layer is possible to be coated by resinifying the lower layer to degrade solvent-solubility. In the case of a conventionally known technique, the foregoing lower layer is completely resinified, but it is unpredictably found out that a pronounced effect to improve function of an element as described above can be produced in the present invention by having a reactive organic compound remaining on the lower layer. It is also confirmed that there is the functional effect of the element as well as a process advantage that a process of preparing the element can be simplified in comparison to a conventional manufacturing process since the remaining state of a reactive compound is preferred.

<<Nonuniform Concentration of Reactive Organic Compound in Organic Layer>>

It is a feature that in an organic layer (referred to also as an organic compound layer) containing a reactive organic compound, which is composed of at least one layer, the reactive organic compound contained in the organic layer has nonuniform concentration at any point in time between termination of a process of preparing the organic electroluminescent element and a start of electricity application to the organic electroluminescent element. Herein, "nonuniform" means that a reactive organic compound contained in a layer has a nonuniform concentration, and may be in a state of concentration distribution. As the nonuniform state, the case where a reactive organic compound contained in an organic layer has a slope in concentration (concentration gradient) as described in Structure 2, the case where there appears the difference in concentration between concentration around the area near one surface of the organic layer and concentration around the area near the other surface of the organic layer as described in Structure 3, or the like is provided as an example in which the state of various detected concentration distributions is a nonuniform state.

As a preferred example of the above-described "nonuniform" state as described in Structure 1, either A1 obtained by dividing absolute value |A−B| by A or B1 obtained by dividing absolute value |A−B| by B is preferably at least 5%, and more preferably at least 10%, where A is an amount of the reactive organic compound existing near one surface of the organic layer, and B is an amount of the reactive organic compound existing near the other surface of the organic layer.

Herein, "near one surface" means a location up to 3 equal parts from the surface layer when thickness of an organic layer is divided into 10 equal parts, preferably a location up to 2 equal parts from the surface layer, and more preferably a location up to one equal part from the surface layer.

<<Means of Analyzing Nonuniform Reactive Organic Compound>>

A means to analyze nonuniform concentration (referred to also as concentration distribution) of a reactive organic compound contained in an organic layer in the present invention will now be described.

As to a means to analyze a nonuniform concentration distribution in an organic layer, whether the concentration is uniform or not can be analyzed by analyzing the organic layer containing a reactive organic compound in the depth direction.

A vinyl group-substituted monomer is taken as the reactive organic compound in the depth direction, contained in the organic layer for example, and the concentration distribution in the layer can be analyzed by measuring a distribution of a double bond of the vinyl group with an analytical method as described below.

An analyzed area capable of being measured with a conventional micro region analytical method should be acquired, but in order to do this, it is effective to cut a thin film on the cross. The area by an amount equivalent to $1/\cos \theta$ ($\theta$ being a value obtained by subtracting an angle of the cutting surface from the normal line of the surface) is enlarged by cutting on the cross in comparison to the case where a cross section perpendicular to the surface is prepared.

As the example, provided are a method of cutting by tilting a glass knife blade employing an ultramicrotome commonly utilized by those skilled in the art, and a method of preparing an area cut on the cross employing SAICAS NN04 type produced by Daipla Wintes Co., Ltd.

After acquiring the analyzed area, the distribution of double bond is to be measured, and there appears several techniques to measure the distribution of double bond. As the analysis means, provided is, for example, a method by which the double bond is labeled by infrared spectroscopic analysis, Raman spectroscopic analysis, or a labeling reagent containing a specific element, and specifically reacting the double bond, and a distribution of the labeled element is measured by an electron probe microanalyzer, an X-ray photoelectron spectrometer, an Auger electron spectroscope analyzer, a time-of-flight secondary ion mass spectrometer and so forth.

Specific analyzed examples of the concentration distribution of the reactive organic compound in the organic layer according to the present invention will be described in the after-mentioned example.

(Specific Examples of Reactive Organic Compound)

Specific examples of the reactive organic compound in the present invention are shown below, but the present invention is not limited thereto.

1-1

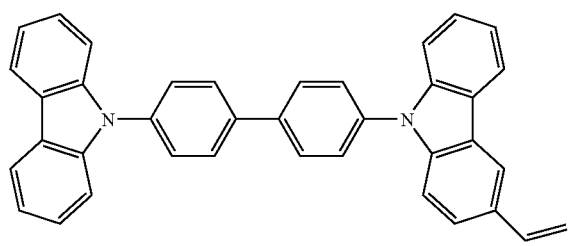

1-2

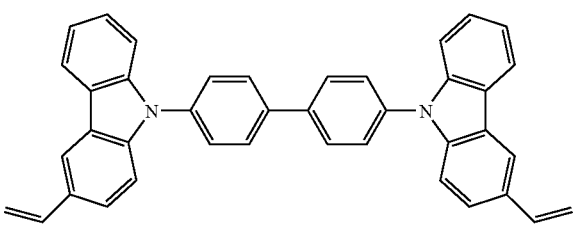

1-3

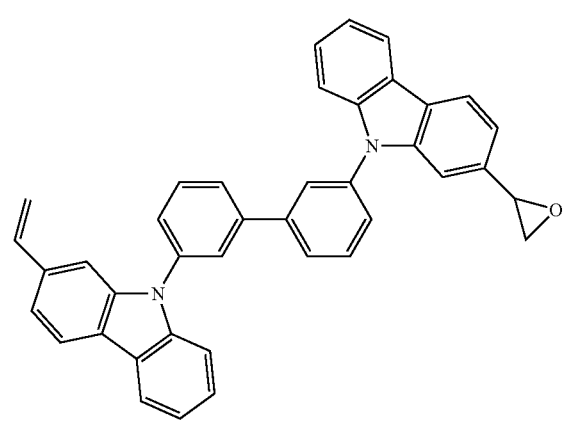

1-4

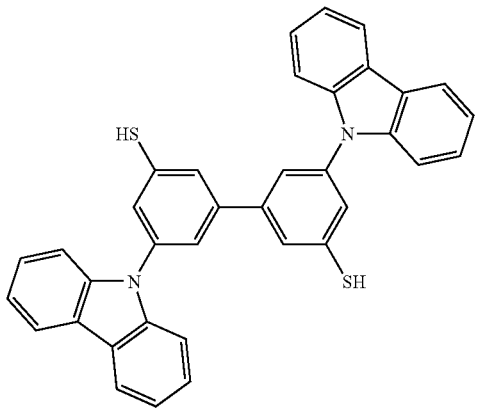

1-5

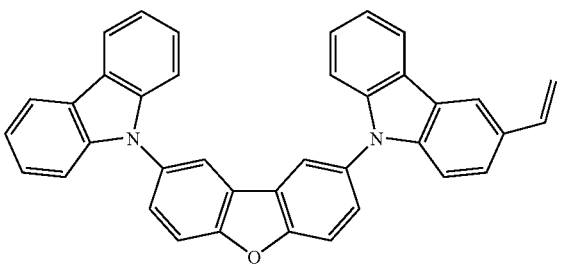

1-6

1-7

1-8

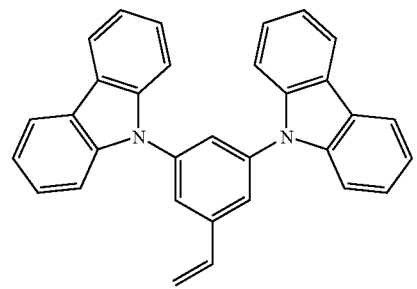

1-9
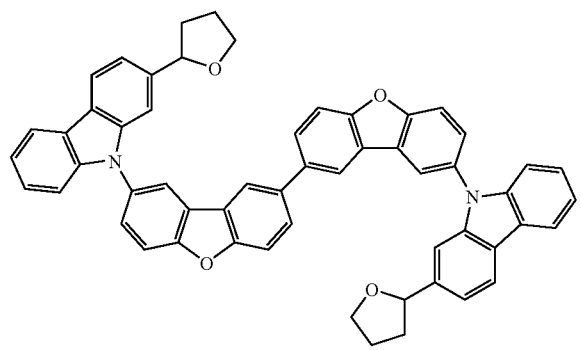
1-10
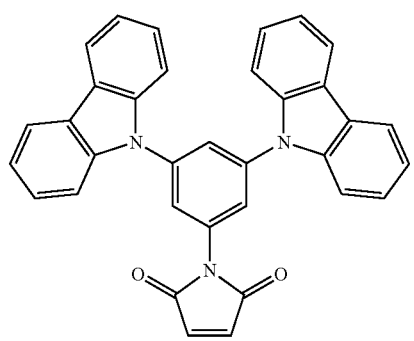
2-1
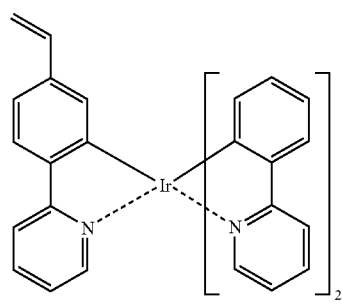
2-2
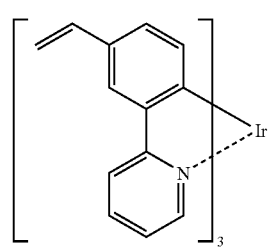
2-3
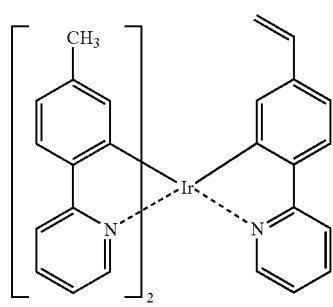
2-4
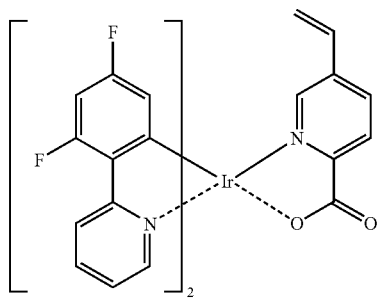
2-5
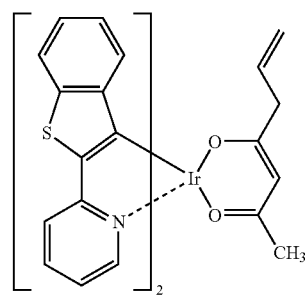
2-6
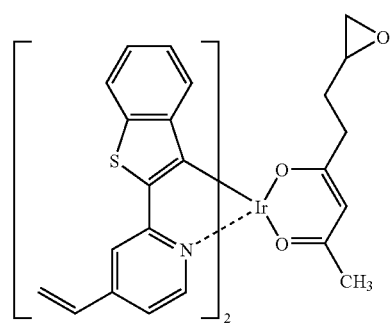
2-7
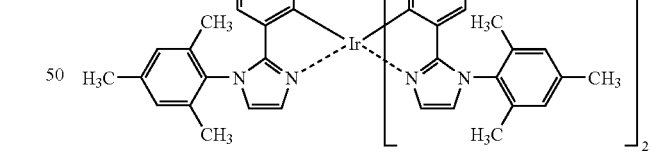
2-8
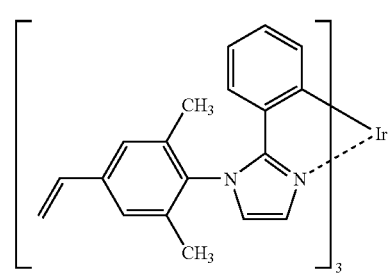

2-9
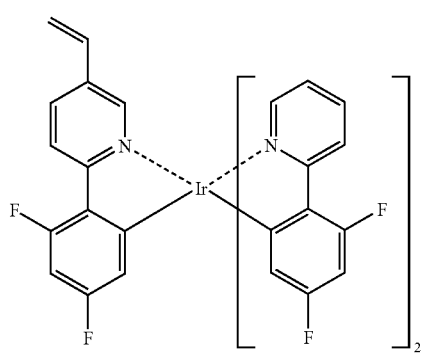
2-10
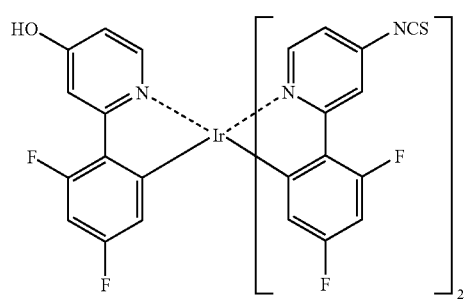
2-11
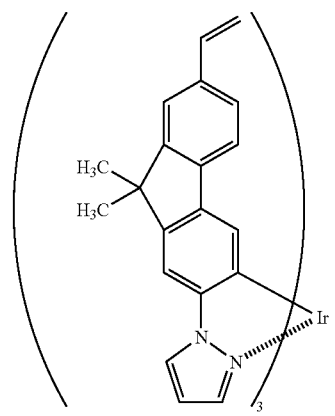
2-12
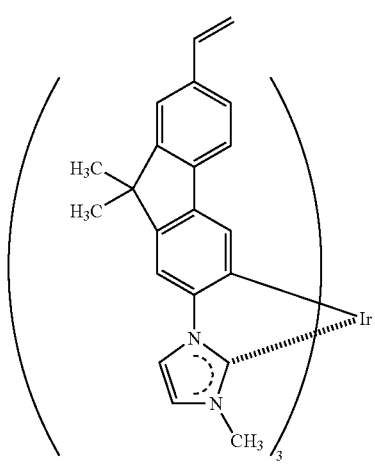
2-13
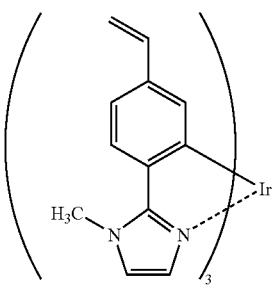
2-14
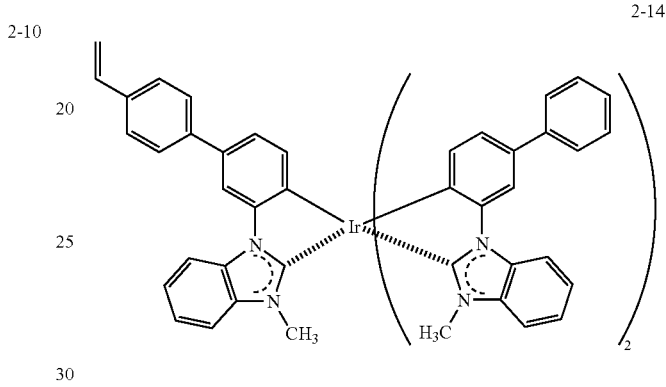
2-15
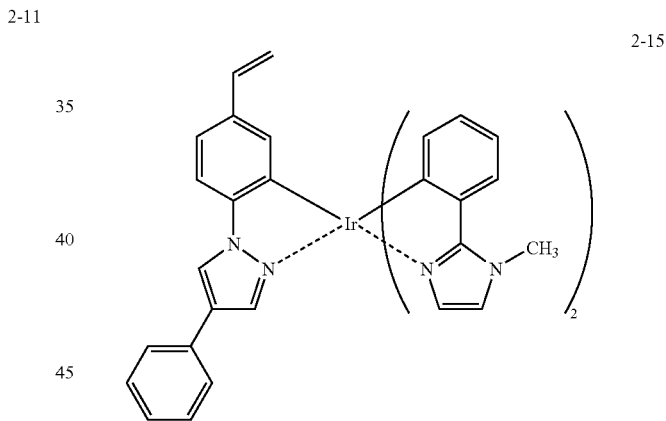
2-16
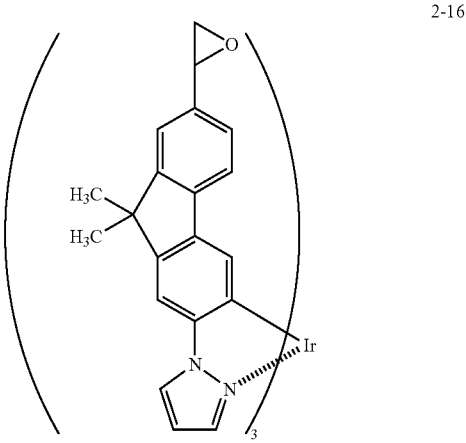

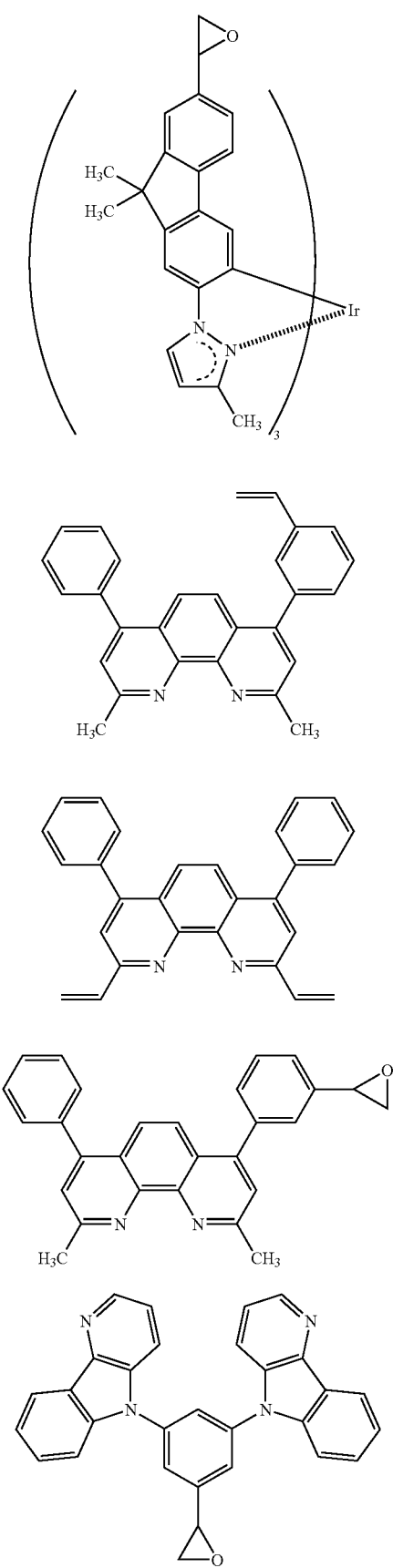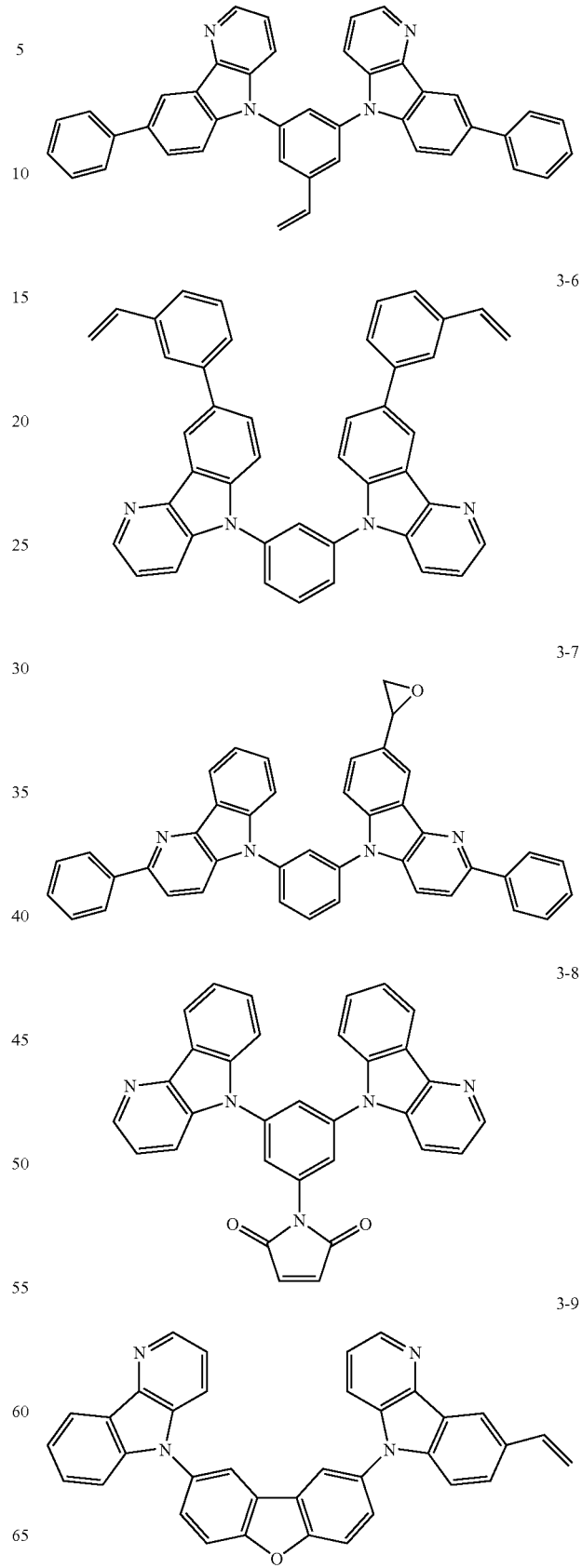

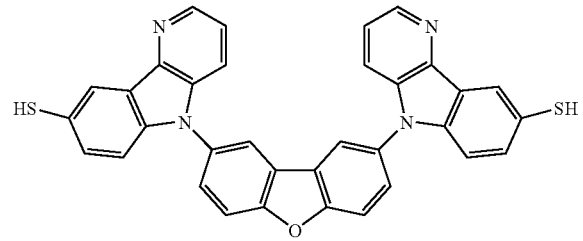
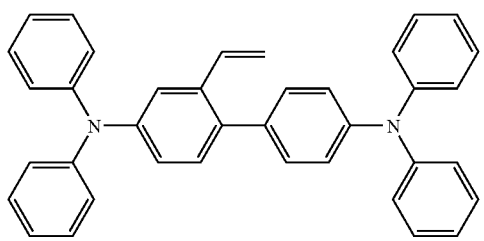

-continued 4-10

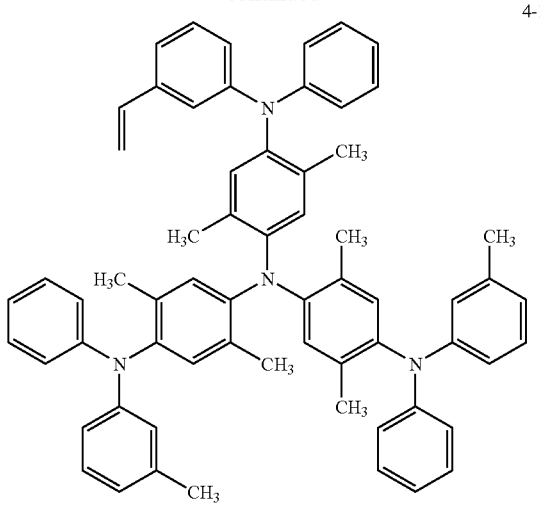

Layers of structure in an organic EL element of the present invention will now be explained. Preferable examples of the layer structure of an organic EL element of the present invention are shown below, but the present invention is not limited thereto.

(i) anode/emission layer/electron transport layer/cathode (ii) anode/hole transport layer/emission layer/electron transport layer/cathode (iii) anode/hole transport layer/emission layer/hole blocking layer/electron transport layer/cathode, (iv) anode/hole transport layer/emission layer/hole blocking layer/electron transport layer/cathode buffer layer/cathode (v) anode/anode buffer layer/hole transport layer/emission layer/hole blocking layer/electron transport layer/cathode buffer layer/cathode The organic EL element of the present invention preferably possesses monochromatic light-emitting layers, namely a blue light emission layer exhibiting a maximum emission wavelength of 430-480 nm, a green light emission layer exhibiting a maximum emission wavelength of 510-550 nm, and a red light emission layer exhibiting a maximum emission wavelength of 600-640 nm, and is fitted into a display device, as described above. Further, at least these three emission layers may be multilayered to prepare a white light emission layer. Furthermore, a nonluminescent intermediate layer may be provided between the emission layers. The organic EL element of the present invention preferably possesses a white light emission layer, and is preferably fitted into a lighting device.

Each layer of an organic EL element of the present invention will be described.

<<Emission Layer>>

The emission layer of the present invention is a layer in which electrons and holes injected from an electrode or an electron transport layer, and a hole transport layer are recombined to emit luminescence, and the emitting portion may be within the emission layer or at the interface between the emission layer and the adjacent layer.

The total layer thickness of the emission layers is not specifically limited, but a thickness of 2 nm-5 μm is preferable in view of improved stability of luminescent color with respect to the driving current, a thickness of 2-200 nm is more preferable, and a thickness of 10-100 nm is still more preferable.

Film formation of an emission dopant and an emission host compound described later on is conducted via a vacuum evaporation method, a spin coating method, an LB method, an ink-jet method or the like to prepare an emission layer.

The emission dopant used in an organic EL element of the present invention preferably contains at least one of the emission host compound and the emission dopant {a phosphorescent dopant (referred to also as a phosphorescence emitting dopant), a fluorescent dopant and so forth}.

{Host Compound (Referred to Also as Emission Host)}

The host compound of the present invention will be described.

Herein, the host compound of the present invention is defined as a compound in which the compound contained in the emission layer has a content of at least 20% by weight in a layer thereof, and the phosphorescent emission has a phosphorescent quantum yield of less than 0.1 at room temperature (25° C.). A phosphorescent quantum yield of less than 0.01 is preferable. Further, the compound contained in the emission layer has a content of at least 20% by weight in a layer thereof.

As the host compound, commonly known host compounds may be used singly or in combination with plural kinds thereof. The transfer of charge can be controlled via combination use of the host compounds to improve efficiency of an organic EL element. Further, it becomes possible to mix different kinds of luminescence by employing plural kinds of the after-mentioned light emission dopants, whereby optional luminescent color can be obtained.

Further, a light emission host of the present invention may be a commonly known low molecular weight compound, be a polymer compound having a repeating unit, or be a low molecular compound having a polymerizable group such as a vinyl group or an epoxy group (a vapor evaporation polymerizable emission host).

As a commonly known host compound which may be employed in combination, preferable is a compound exhibiting hole transport capability and electron transport capability, prevention of luminescence at a long wavelength, and high Tg (glass transition temperature).

Specific examples of the commonly known host compound include compounds described in the following documents.

Japanese Patent O.P.I. Publication No. 2001-257076, Japanese Patent O.P.I. Publication No. 2002-308855, Japanese Patent O.P.I. Publication No. 2001-313179, Japanese Patent O.P.I. Publication No. 2002-319491, Japanese Patent O.P.I. Publication No. 2001-357977, Japanese Patent O.P.I. Publication No. 2002-334786, Japanese Patent O.P.I. Publication No. 2002-8860, Japanese Patent O.P.I. Publication No. 2002-334787, Japanese Patent O.P.I. Publication No. 2002-15871, 2002-334788, Japanese Patent O.P.I. Publication No. 2002-43056, Japanese Patent O.P.I. Publication No. 2002-334789, Japanese Patent O.P.I. Publication No. 2002-75645, 2002-338579, Japanese Patent O.P.I. Publication No. 2002-105445, Japanese Patent O.P.I. Publication No. 2002-343568, Japanese Patent O.P.I. Publication No. 2002-141173, Japanese Patent O.P.I. Publication No. 2002-352957, Japanese Patent O.P.I. Publication No. 2002-203683, Japanese Patent O.P.I. Publication No. 2002-363227, Japanese Patent O.P.I. Publication No. 2002-231453, Japanese Patent O.P.I. Publication No. 2003-3165, Japanese Patent O.P.I. Publication No. 2002-234888, 2003-27048, Japanese Patent O.P.I. Publication No. 2002-255934, Japanese Patent O.P.I. Publication No. 2002-260861, Japanese Patent O.P.I. Publication No. 2002-280183, Japanese Patent O.P.I. Publication No. 2002-299060, Japanese Patent O.P.I. Publication No. 2002-302516, Japanese Patent O.P.I.

Publication No. 2002-305083, Japanese Patent O.P.I. Publication No. 2002-305084 and Japanese Patent O.P.I. Publication No. 2002-308837.

(Emission Dopant)

The emission dopant of the present invention will now be described.

A fluorescent dopant (referred to also as a fluorescent compound) and a phosphorescent dopant (referred to also as a phosphorescence light-emitting body, a phosphorescent compound or a phosphorescence light-emitting compound) are utilized as an emission dopant of the present invention, but the emission dopant (also referred to simply as a light-emitting material) employed in an emission layer or in an emission unit of the organic EL element in the present invention preferably contains the phosphorescent dopant together the above-described host compound in view of preparation of an organic EL element exhibiting a higher emission efficiency.

(Phosphorescent Dopant)

A phosphorescent dopant of the present invention will now be described.

The phosphorescent dopant is a compound in which luminescence from the excited triplet is observed, which is specifically a compound by which phosphorescence is emitted at room temperature (25° C.), and is defined as a compound having a phosphorescent quantum yield of at least 0.01 at 25° C., but preferable is a phosphorescent quantum yield of at least 0.1 at 25° C.

The phosphorescent quantum yield can be measured with a method described in the 4$^{th}$ edition "Jikken Kagaku Koza 7", Bunko II, page 398 (1992) published by Maruzen. Measurement of the phosphorescent quantum yield can be conducted in a solution employing various kinds of solvents, but in the case of a phosphorescent dopant of the present invention, the above-described phosphorescent quantum yield of at least 0.01 may be achieved in any of arbitrary solvents.

There are two types of luminescence of the phosphorescent dopant in principle, one is an energy transfer type in which the carrier is recombined on a host compound by which the carrier is transported to form an excited state of the host compound, the resulting energy is transferred into the phosphorescent dopant to obtain luminescence from the phosphorescent dopant, and the other is a carrier trap type in which the phosphorescent dopant serves as a carrier trap, and the carrier is recombined on the phosphorescent dopant to obtain luminescence from the phosphorescent dopant. However, in any of the types, desired is the condition where energy at an excited state of the phosphorescent dopant is lower than that at an excited state of the host compound.

The phosphorescent dopant can be appropriately selected from commonly known dopants employed for an emission layer fitted into an organic EL element.

The phosphorescent dopant of the present invention is preferably a complex compound containing a metal of Groups 8-10 in the periodic table, and more preferably an iridium compound, an osmium compound, a platinum compound (a platinum complex compound) or a rare-earth metal complex. Of these, an iridium compound is most preferable.

Specific examples of the compound employed as a phosphorescent dopant are shown below, but the present invention is not limited thereto. These compounds can be synthesized, for example, with a method described in Inorg. Chem., vol. 40, 1704-1711.

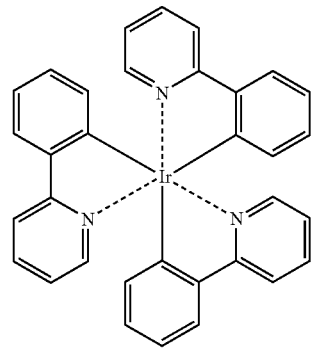

Ir-1

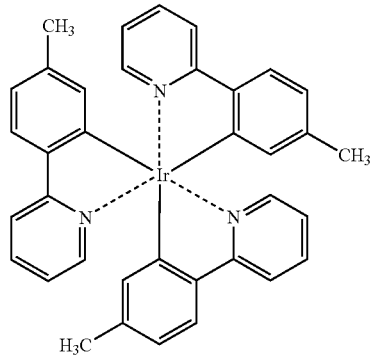

Ir-2

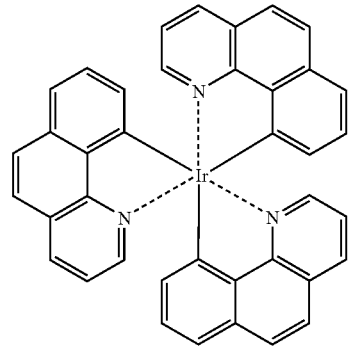

Ir-3

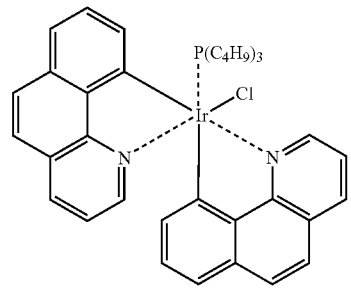

Ir-4

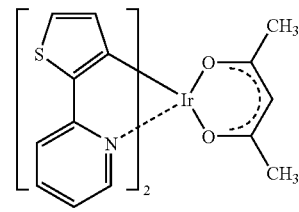

Ir-5

Ir-6
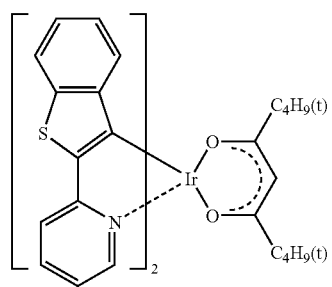
Ir-7
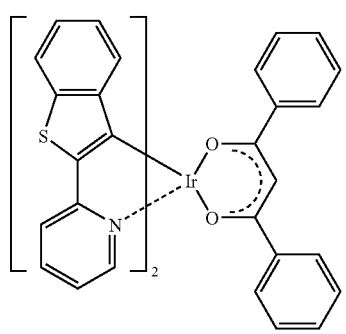
Ir-8
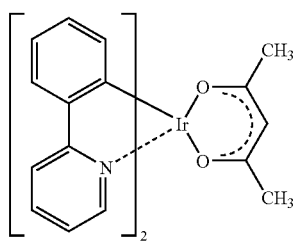
Ir-9
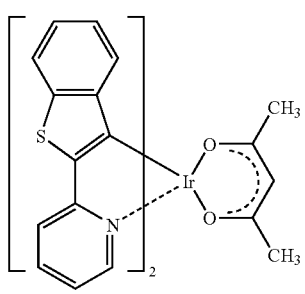
Ir-10
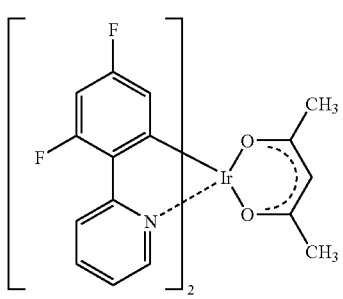
Ir-11
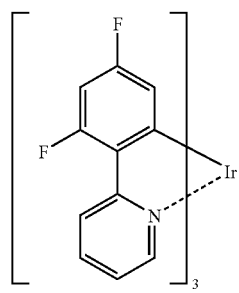
Ir-12
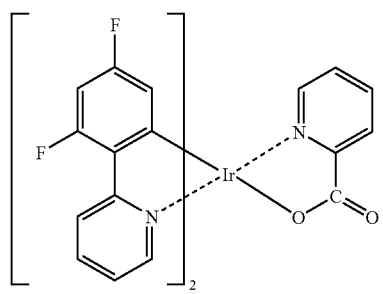
Ir-13
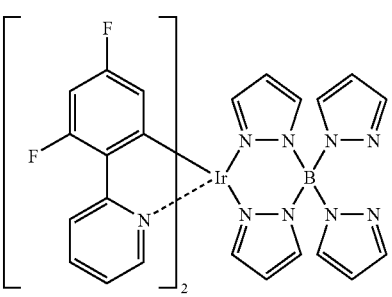
Ir-14
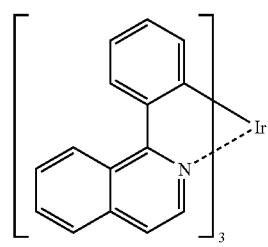
Ir-15
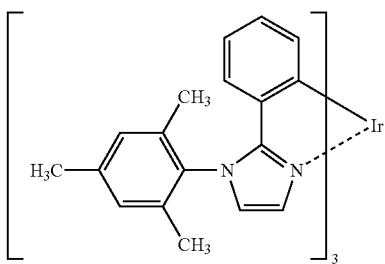
Ir-16
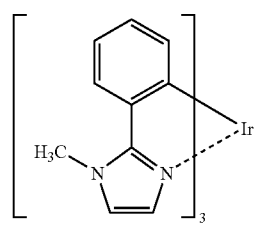

Pt-1
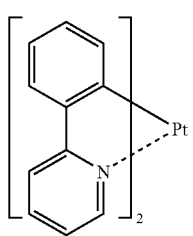
Pt-2
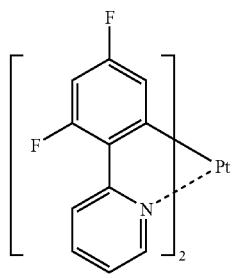
Pt-3
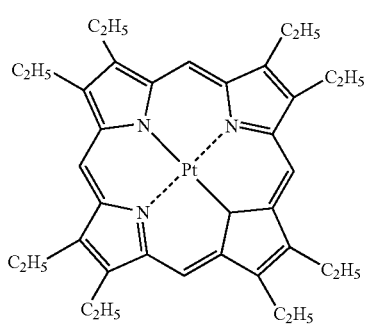
A-1
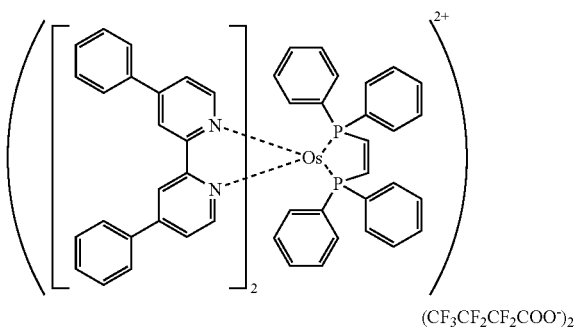
D-1
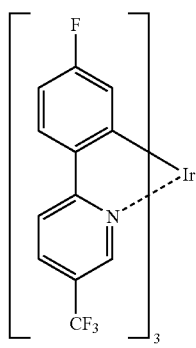
D-2
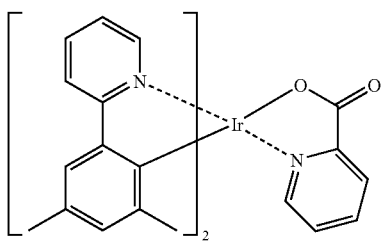
D-3
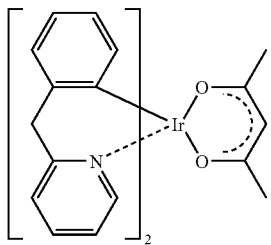
D-4
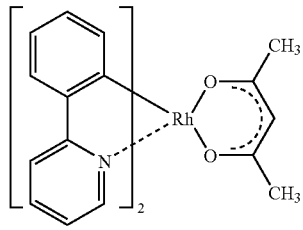
D-5
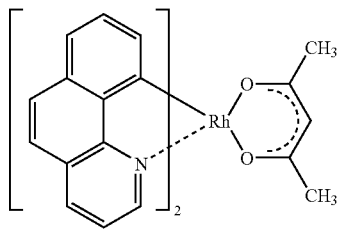
D-6
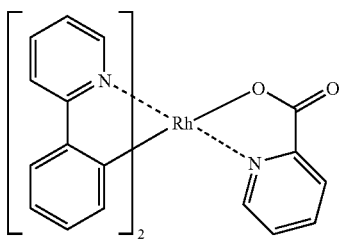
Pd-1

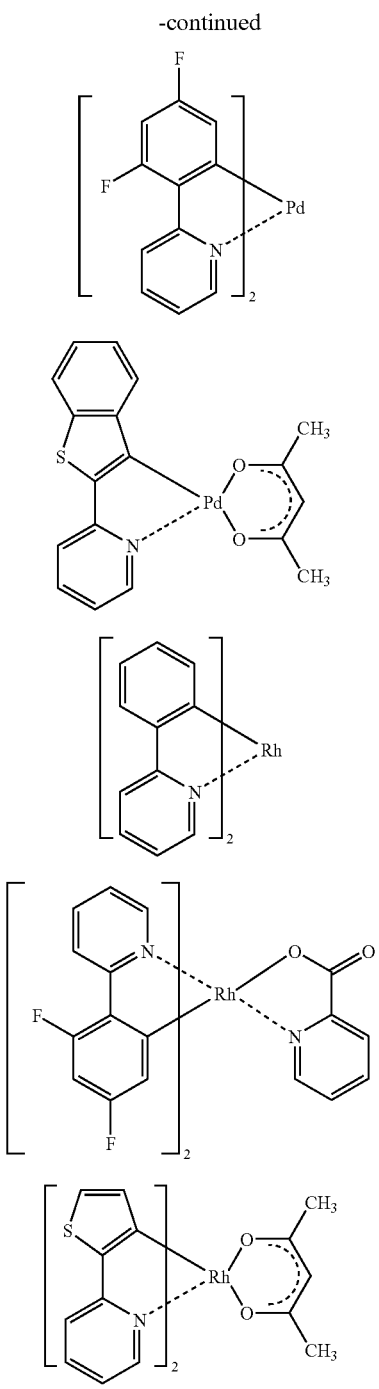

{Fluorescent Dopant (Referred to Also as Fluorescent Compound)}

Examples of the fluorescent dopant (fluorescent compound) include a cumarin based dye, a pyrane based dye, a cyanine based dye, a chloconium based dye, a squalenium based dye, an oxobenzanthracene based dye, a fluoresceine based dye, a rhodamine based dye, a pyrylium based dye, a perylene based dye, a stilbene based dye, a polythiophene based dye, a rare-earth complex based fluorescent material and so forth.

Next, an injection layer, a blocking layer, an electron transport layer and so forth employed as layers of structure in an organic EL element of the present invention will be described.

<<Injection Layer: Electron Injection Layer, Hole Injection Layer>>

The injection layer provided according to necessity is classified into an electron injection layer and a hole injection layer. The injection layer may be provided between an anode and an emission layer or a hole transport layer, or between a cathode and an emission layer or an electron transport layer.

The injection layer is a layer provided between an electrode and an organic layer to improve a driving voltage drop and emission luminance. The injection layer is described in detail in "Yuuki EL soshi to sono kougyouka saizennsenn (Organic EL elements and forefront of their industrialization) Vol. 2, Sect. 2, "Electrode materials" pages 123-166, Nov. 30, 1998, published by NTS Inc., and includes the hole injection layer (anode buffer layer) and the electron injection layer (cathode buffer layer).

The anode buffer layer (hole injection layer) is described in detail in Japanese Patent O.P.I. Publication No. 9-45479, Japanese Patent O.P.I. Publication No. 9-260062 and Japanese Patent O.P.I. Publication No. 8-288069, and specific examples thereof include a phthalocyanine buffer layer typically made of copper phthalocyanine, an oxide buffer layer typically made of vanadium oxide, an amorphous carbon buffer layer and a polymer buffer layer employing a conductive polymer such as polyaniline (emeraldine) or polythiophene.

The cathode buffer layer (electron injection layer) is also described in detail in Japanese Patent O.P.I. Publication No. 6-325871, Japanese Patent O.P.I. Publication No. 9-17574, Japanese Patent O.P.I. Publication No. 10-74586, and so forth, examples thereof include a metal buffer layer typically made of strontium or aluminum, an alkali metal compound buffer layer typically made of lithium fluoride, an alkaline earth metal compound buffer layer typically made of magnesium fluoride and an oxide buffer layer typically made of aluminum oxide. The buffer layer (injection layer) is preferably a very thin layer and the thickness thereof is preferably 0.1 nm-5 μm, depending on the material.

<<Blocking Layer: Hole Blocking Layer and Electron Blocking Layer>>

Blocking layers other than basic layers of structure as thin organic compound layers are provided, if desired. Examples thereof include hole blocking layers described in Japanese Patent O.P.I. Publication No. 11-204258 and Japanese Patent O.P.I. Publication No. 11-204359, as well as on page 237 of "Yuki EL Soshi to Sono Kogyoka Saizensen (Organic EL elements and forefront of their industrialization)" (published by NTS Inc., 30 Nov., 1998).

The hole blocking layer exhibits the function of an electron transport layer in a broad sense, which is composed of a material exhibiting minimized hole transportability while exhibiting the function of electron transportability, and makes it possible to enhance recombination probability of electrons and holes by blocking holes while transporting electrons. Further, the structure of the after-mentioned electron transport layer can be utilized as a hole blocking layer of the present invention, if desired.

It is preferable that the hole blocking layer provided in the organic EL element of the present invention is arranged to be provided adjacent to an emission layer.

The hole blocking layer preferably contain an azacarbazole derivative provided as the foregoing host compound.

Further, in the present invention, in the presence of a plurality of emission layers having a plurality of different luminescent colors, it is preferable that the emission layer having a maximum emission wavelength of the shortest wavelength among all the emission layers is closest to an anode, but in such the case, it is preferable that a hole blocking layer is additionally provided between the shortest wavelength layer and the emission layer closest to the anode next to the shortest wavelength layer. Further, at least 50% by weight of a compound contained in the hole blocking layer provided at that position preferably has an ionization potential higher than 0.3 eV, with respect to that of a host compound in the foregoing shortest wavelength emission layer.

The ionization potential is defined as energy to release electrons at HOMO (the highest occupied molecular orbit) of a compound to the vacuum level, and determined by a method described below.

(1) Gaussian 98 (Gaussian 98, Revision A. 11.4, M J. Frisch, et al., Gaussian, Inc., Pittsburgh Pa., 2002) is utilized as the molecular orbit calculation software produced by Gaussian, Inc., in U.S.A., and structural optimization is conducted with B3LYP/6-31G* as a key word to determine the ionization potential as the calculated value (conversion value in terms of eV unit) being rounded off at the second decimal place. Background in which this calculated value is effective is because the calculated value obtained by this method and the experimental value exhibit high correlation.

(2) The ionization potential can be determined via direct measurement by a photoelectron spectroscopy method.

For example, it can be determined with a low energy electron spectrometer "Model AC-1", manufactured by Riken Keiki Co., Ltd., or a method known as ultraviolet photoelectron spectroscopy is usable.

On the other hand, the electron blocking layer exhibits the function of a hole transport layer in a broad sense, which is composed of a material exhibiting minimized electron transportability while exhibiting the function of hole transportability, and makes it possible to enhance recombination probability of electrons and holes by blocking electrons while transporting holes. Further, the structure of the after-mentioned hole transport layer can be utilized as an electron blocking layer of the present invention, if desired. The hole blocking layer and the electron transport layer of the present invention each preferably have a thickness of 3-100 nm, and more preferably have a thickness of 5-30 nm.

<<Hole Transport Layer>>

The hole transport layer is composed of a hole transport material exhibiting the function of transporting holes, and in a broad sense, includes a hole injection layer and an electron blocking layer. The hole transport layer can be provided as a single layer or a plurality of layers.

Hole transport materials are those which exhibit either injection or transportation of holes, or blocking of electrons, and may be either organic or inorganic compounds. Examples thereof include triazole derivatives, oxazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, and aniline based copolymers, as well as electrically conductive macromolecular oligomers, especially thiophene oligomers.

It is possible to employ the above materials as hole transport materials. In addition, it is preferable to employ porphyrin compounds, aromatic tertiary amine compounds, and styrylamine compounds. Of these, it is particularly preferred to employ aromatic tertiary amine compounds.

Typical examples of the aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis (4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl) phenylmethane, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4-diaminodiphenyl ether, 4,4'-bis(diphenylamino) quaterphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostilbene, and N-phenylcarbazole. Further listed are compounds having two condensed aromatic rings in the molecule such as 4,4'-bis[N-(1-naphthyl)-N-phenylamino]biphenyl (NPD), described in U.S. Pat. Nos. 5,061,569 and 4,4',4"-tris[N-(3-methylphenyl)-N-phenylamino] triphenylamine (MTDATA) in which three triphenylamine units are linked in a starburst type, described in Japanese Patent O.P.I. Publication No. 4-308688.

In addition, it is possible to employ polymer materials which are formed by introducing the above materials into polymer chains or in which the above materials are employed as a main chain. Further, it is possible to employ inorganic compounds such as p type-Si or p type SiC as a hole injection material and a hole transport material.

Utilized can be p type Hole transport materials described in Japanese Patent O.P.I. Publication No. 11-251067, and J. Huang et al. literature (Applied Physics Letters 80 (2002). In the present invention, these materials are preferably used since light-emitting elements exhibiting higher efficiency can be obtained.

It is possible to form a hole transport layer in such a way that the above hole transport materials are subjected to thin film formation with methods, known in the art, such as a vacuum evaporation method, a spin coating method, a casting method, a printing method including an ink-jet method, or an LB method. The thickness of the hole transport layer is not particularly limited. The above thickness is commonly 5 nm-5 µm, but is preferably 5-200 nm. The above hole transport layer may have a single layer structure composed of at least one kind of the above materials.

Hole transport materials exhibiting a high p type property, which have been doped with impurities, can also be utilized. Examples thereof include those described in Japanese Patent O.P.I. Publication No. 4-297076, Japanese Patent O.P.I. Publication No. 2000-196140, and Japanese Patent O.P.I. Publication No. 2001-102175, as well as J. Appl. Phys., 95, 5773 (2004).

In the present invention, it is preferable to utilize such the hole transport layer exhibiting a high p type property since elements in low power consumption are possible to be prepared.

<<Electron Transport Layer>>

The electron transport layer is composed of a material exhibiting the function to transport electrons, and includes, in a broad sense, an electron injection layer and a hole blocking layer. The electron transport layer may be provided as a single layer or a plurality of layers.

Heretofore, in the case of a single electron transport layer or a plurality of electron transport layers, electron transport materials (which also work as hole blocking materials), which are employed in the electron transport layer adjacent to the cathode electrode side with respect to the emission layer, have been applicable when they exhibit the function to transfer electrons injected from the cathode to the emission layer. As such materials, it is possible to employ any of those selected from the compounds known in the art. Examples thereof include nitro-substituted fluorene derivatives, diphenylquinone derivatives, thiopyran dioxide derivatives, carbodiimide, fluorenylydenemethane derivatives, anthraquinodimethane and anthrone derivatives, as well as oxadiazole derivatives. Further employed as electron transport materials may be thiadiazole derivatives, which are prepared by replacing the oxygen atom of the oxadiazole ring in the above oxadiazole derivatives with a sulfur atom, as well as quinoxaline derivatives known as an electron attractive group. Further, it is possible to employ polymer materials which are prepared by introducing any of the above materials into the polymer chain or in which any of the above materials are employed as the main chain of the polymer.

Further employed as the electron transport materials may be metal complexes of 8-quinolinol derivatives such as tris (8-quinolinol) aluminum (Alq), tris (5,7-dichloro-8-quinolinol) aluminum, tris (5,7-dibromo-8-quinilinol) aluminum, tris (2-methyl-8-quinolinol) aluminum, tris (5-methyl-8-quinilinol) aluminum, or bis(8-quinolinol) zinc (Znq), or metal complexes in which the mail metal of these metal complexes is replaced by In, Mg, Cu, Ca, Sn, Ga, or Pb. Other than these, preferably employed as the electron transport materials may be metal free or metal phthalocyanines, or compounds in which the end of the above phthalocyanine is substituted with an alkyl group or a sulfonic acid group. Further employed as electron transport materials may be distyrylpyrazine derivatives. Still further employed as electron transport materials may be inorganic semiconductors such as n type-Si or n type-SiC in the same manner as in the hole injection layer and hole transport layer.

It is possible to form an electron transport layer in such a way that the above electron transport materials are subjected to thin film formation with methods, known in the art, such as a vacuum evaporation method, a spin coating method, a casting method, a printing method including an ink-jet method, or an LB method. The thickness of the electron transport layer is not particularly limited. The above thickness is commonly 5 nm-5 μm, but is preferably 5-200 nm. The above electron transport layer may have a single layer structure composed of at least one kind of the above materials.

Electron transport materials exhibiting a high n type property, which have been doped with impurities, can be utilized. Examples thereof include those described in Japanese Patent O.P.I. Publication No. 4-297076, Japanese Patent O.P.I. Publication No. 10-270172, Japanese Patent O.P.I. Publication No. 2000-196140, and Japanese Patent O.P.I. Publication No. 2001-102175, as well as J. Appl. Phys., 95, 5773 (2004).

In the present invention, it is preferable to utilize such the electron transport layer exhibiting a high n type property since elements in low power consumption are possible to be prepared.

<<Anode>>

As an anode fitted into the organic EL element, preferably employed are those which employ, as electrode materials, metals, alloys, electrically conductive compounds, and mixtures thereof, which exhibit a relatively high work function (at least 4 eV). Specific examples of such electrode materials include metals such as Au, and electrically conductive transparent materials such as CuI, indium tin oxide (ITO), $SnO_2$, or ZnO. Further employed may be IDIXO ($In_2O_3$—ZnO) which enables formation of an amorphous, transparent, and electrically conductive film. The anode may be formed in such a manner that a thin film is formed via methods such as vapor deposition or sputtering, employing these electrode materials, and the desired shaped pattern is formed via a photolithographic method. Further, when pattern accuracy is not strongly needed (at least about 100 μm), a pattern may be formed via the desired shaped mask during vapor deposition or sputtering of the above electrode materials. Alternately, when materials such as organic electrically conductive compounds, capable of being coated, are employed, it is possible to employ wet system film making methods such as a printing system or a coating system. When luminescence is output from this anode, it is desirable that transmittance is at least 10%, and it is preferable that sheet resistance as the anode is at most a few hundred $\Omega/\square$. Further, the selected film thickness, depending on materials, is commonly in the range of 10-1000 nm, but is preferably in the range of 10-200 nm.

<<Cathode>>

On the other hand, as a cathode preferably employed are those which employ, as electrode materials, metal (called electron injecting metals), alloys, electrically conductive compounds, and mixtures thereof, which exhibit a relatively low work function (at most 4 eV). Specific examples of such electrode materials include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and rare earth metals. Of these, in view of electron injection capability and resistance to oxidation, suitable are mixtures of an electron injecting metal and a second metal which is stable and exhibits a higher work function than that of the above metal, such as a magnesium/silver mixture, a magnesium/aluminum mixture, a magnesium/indium mixture, an aluminum/aluminum oxide ($Al_2O_3$) mixture, a lithium/aluminum mixture, or aluminum. It is possible to prepare the cathode via formation of a thin film of the above electrode materials, employing methods such as vapor deposition or sputtering. It is preferable that sheet resistance as the cathode is at most a few hundred $\Omega/\square$. Further, the film thickness is commonly selected to be in the range of 10 nm-5 μm, but is preferably selected to be in the range of 50-200 nm. In addition, in order to transmit emitted light, it is advantageous that either the anode or the cathode is transparent or translucent to enhance emission luminance.

Further, it is possible to prepare a transparent or translucent cathode in such a manner that after preparing the above metal film, of a thickness of 1-20 nm, on the cathode, conductive transparent materials, listed in the description of the anode, are applied onto the above film. By applying the above, it is possible to prepare an element in which both the anode and the cathode exhibit transparency.

<<Support Substrate>>

Support substrates (hereinafter, referred to also as substrates, base boards, base materials, or supports) are not particularly limited to kinds of glass and plastic, and may further be transparent or opaque. When light is output from the substrate side, the substrate is preferably transparent. It is possible to list, as preferably employed transparent substrates, glass, quartz, or a transparent resin film. Of these, the particularly preferred substrate is a resin film capable of exhibiting flexibility in the organic EL element.

Examples of the resin film material include polyester such as polyethylene terephthalate (PET), or polyethylene naphthalate (PEN); cellulose esters or derivatives thereof such as polyethylene, polypropylene, cellophane, cellulose diacetate, cellulose triacetate, cellulose acetate butyrate, cellulose acetate propionate (CAP), cellulose acetate phthalate (TAC), or cellulose nitrate; polyvinylidene chloride, polyvinyl alcohol, polyethylene vinyl alcohol, syndiotactic polystyrene, polycarbonate, norbornene resins, polymethylpentane, polyether ketone, polyimide, polyether sulfone (PES), polyphenylene sulfide, polysulfones, polyetherimide, polyetherketoneimide, polyamide, fluororesins, nylon, polymethyl methacrylate, acryl or polyacrylates, and cycloolefin based resins such as ARTON (a registered trade, produced by JSR Corp.) or APERU (a registered trade name, produced by Mitsui Chemical Co., Ltd.).

The surface of a resin film is formed from a film made of an inorganic compound or an organic compound, or from a hybrid film made of both of them. The resulting film is preferably a barrier film having a water vapor permeability of at most 0.01 g/(m$^2$·24 hours) {at 25±0.5° C. and relative humidity (90±2) % RH}, which is determined by the method based on JIS K 7129-1992. Further, the above film is preferably a high barrier film having an oxygen permeability of at most $10^{-3}$ ml/(m$^2$·24 hours·Mpa) determined by the method based on JIS K 7126-1987 and a water vapor permeability of at most $10^{-5}$ g/(m$^2$·24 hours).

As a material to form the barrier film, employed may be those which exhibit the function to retard penetration of materials such as moisture or oxygen which degrade elements, and it is possible to employ, for example, silicon oxide, silicon dioxide, or silicon nitride. Further, in order to decrease brittleness, it is preferable to form a laminated layer structure composed of an inorganic layer and a layer made of organic materials. The lamination order of the inorganic and organic layers is not particularly limited. It is preferable that both are alternately laminated several times.

Preparation methods of the barrier film are not particularly limited, and it is possible to employ, for example, a vacuum evaporation method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method. Of these, particularly preferred is the atmospheric pressure plasma polymerization method, as described in Japanese Patent O.P.I. Publication No. 2004-68143.

Examples of opaque substrates include metal plates and films made of aluminum or stainless steel, opaque resin substrates, and substrates made of ceramic materials.

The externally output efficiency of luminescence of an organic EL element at room temperature is preferably at least 1%, but more preferably at least 5%. Herein, externally output quantum efficiency (%)=(the number of photons which emitted outside an organic EL element/the number of electrons passed through the organic EL element)×100.

Further, hue improving filters such as color filters may be used in combination, and color conversion filters by which luminescent color from the organic EL element is concerted into multi-color, employing a phosphor may also be used in combination. In cases where the color conversion filters are employed, luminescence of the organic EL element preferably has a λmax of at most 480 nm.

<<Sealing>>

As a sealing means of the present invention, provided can be a method by which a sealing member adheres to an electrode and a substrate employing an adhesive, for example.

The sealing member may be arranged to cover the display region of the organic EL element, and may be either in the form of an intaglio plate or a flat plate. Further, transparency and electric insulation are not particularly limited.

Specifically listed are a glass plate, a polymer plate or film, and a metal plate or film. Examples of the glass plate may include specifically soda-lime glass, barium and strontium containing glass, lead glass, aluminosilicic acid glass, borosilicic acid glass, barium borosilicic acid glass, and quartz. Further, examples of the polymer plate may include those composed of polycarbonate, acryl, polyethylene terephthalate, polyether sulfide or polysulfone, while listed as the metal plates may be those composed of at least one metal selected from the group consisting of stainless steel, iron, copper, aluminum, magnesium, nickel, zinc, chromium, titanium, molybdenum, silicon, germanium and tantalum, or an alloy composed of at least two metals selected from the above group.

In the present invention, polymer and metal films are preferably usable since an element can be formed as a thin film element. Further, it is preferable that the polymer film has an oxygen permeability of at most $1\times10^{-3}$ ml/(m$^2$·24 hours·Mpa), measured by the method based on JIS K 7126-1987, and a water vapor permeability {at 25±0.5° C. and relative humidity (90±2) % RH} of at most $1\times10^{-3}$ g/(m$^2$·24 hours), measured by the method based on JIS K 7129-1992.

In order to concave a sealing member, sand blasting, chemical etching and so forth are employed.

It is possible to specifically list, as an adhesive, photocurable and thermocurable type adhesives each having a reactive vinyl group of an acrylic acid based oligomer and a methacrylic acid based oligomer, and moisture curable type adhesives such as 2-cyanoacrylic acid ester and so forth. It is also possible to list a thermal and chemical curing type (two liquid mixture). It is further possible to list hot-melt type polyamide, polyester, and polyolefin. It is still further possible to list cationically curable type UV curable type epoxy resin adhesives.

Since organic EL elements are occasionally degraded because of a thermal treatment, preferred are those which are adhesion-curable from room temperature to 80° C. Further, desiccants may be dispersed into the above adhesives. Adhesives may be coated onto the sealing portion by a commercial dispenser or may be printed so as to print in the same manner as screen printing.

Further, inorganic and organic material layers are formed in such a configuration that in the outside of an electrode on the side which interposes an organic layer and faces a substrate, the foregoing electrode and organic layer are covered in the form of being in contact with the substrate. The above-described inorganic and organic layer is preferably employed as the sealing film. In this case, any of the materials may be applied to the foregoing film as long as they exhibit the function to retard penetration of materials, such as moisture or oxygen, which result in degradation of the element. Usable examples thereof include silicon oxide, silicon dioxide, and silicon nitride. Further, in order to improve flexibility of the foregoing film, it is preferable that a laminated layer structure is realized by employing these inorganic layers and layers composed of organic materials. Methods of forming these films are not particularly limited, and it is possible to employ, for example, a vacuum evaporation method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, a coating method or the like.

It is preferable that in a gas and liquid phase, inert gas such as nitrogen or argon and inert fluid such as fluorinated hydrocarbon or silicone oil are injected into the space between the sealing member and the display area of the organic EL element. Further, it is possible to form a vacuum. Still further, it is possible to enclose hygroscopic compounds within the interior.

Examples of hygroscopic compounds include metal oxides (for example, sodium oxide, potassium oxide, calcium oxide, barium oxide, magnesium oxide, or aluminum oxide), sulfates (for example, sodium sulfate, calcium sulfate, magnesium sulfate, or cobalt sulfate), metal halides (for example, calcium chloride, magnesium chloride, cesium fluoride, tantalum fluoride, cerium bromide, magnesium bromide, barium iodide, or magnesium iodide), and perchlorates (for example, barium perchlorate or magnesium perchlorate). Of sulfates, metal halides, and perchlorates, anhydrous salts are suitably employed.

<<Protective Film and Protective Plate>>

In order to enhance mechanical strength of the element, a protective film or a protective plate may be provided on the outer side of the above sealing film on the side facing a substrate, while interposing an organic layer or the above sealing film. Specifically, when sealing is conducted via application of the above sealing film, the resulting strength is not always sufficient. Consequently, it is preferable to provide the above protective film or protective plate. It is possible to employ, as usable materials for the above, glass plates, polymer plate or polymer film, and metal plate or metal film which are the same as those employed for the above sealing. In view of lightweight and thin film formation, it is preferable to employ polymer films.

<<Outputting of Light>>

It is commonly stated that in organic EL elements, luminescence occurs in the layer at a refractive index (being about 1.7-about 2.1) higher than that of air, whereby only about 15-20% of light emitted in the emission layer is output. The reasons are that light, incident to the interface (being the interface between the transparent substrate and air) at angle θ, which is greater than the critical angle, is totally reflected, whereby no light can be removed outside an element, and light is totally reflected between the transparent electrode or the emission layer and the transparent substrate, so that the light is lead to the transparent electrode or the emission layer, whereby light escapes in the element side direction.

Examples of methods to improve this light-outputting efficiency include, for example, a method in which irregularity is formed on the surface of the transparent substrate so that total reflection at the interface between the transparent substrate and air is minimized (for example, U.S. Pat. No. 4,774,435); a method in which efficiency is enhanced by allowing the substrate to exhibit light focusing properties (for example, Japanese Patent O.P.I. Publication No. 63-314795); a method in which a reflective surface is formed on the side of the element (for example, Japanese Patent O.P.I. Publication No. 1-220394); a method in which a flat layer exhibiting an intermediate refractive index is introduced between the substrate and the light-emitting body, whereby an reflection inhibiting film is formed (for example, Japanese Patent O.P.I. Publication No. 62-172691); a method in which a flat layer of a refractive index lower than that of the substrate is introduced between the above substrate and the light-emitting body (for example, Japanese Patent O.P.I. Publication No. 2001-202827); and a method in which a diffraction grating is arranged between the substrate and any layer of the transparent electrode layer and the light-emitting layer (including between the substrate and the exterior (Japanese Patent O.P.I. Publication No. 11-283751).

In the present invention, it is possible to employ these methods in combination with an organic EL element of the present invention, but it is also possible to employ an appropriate method in which a flat layer having a refractive index lower than that of the substrate is introduced between the above substrate and the light-emitting body, or a method in which a diffraction grating is suitably arranged between the substrate and any layer of the transparent electrode layer and the emission layer (including between the substrate and the exterior).

These methods can be employed in combination in the present invention to obtain an element exhibiting higher luminance and excellent durability.

By forming a medium of a low refractive index at a thickness greater than the wavelength of light between the transparent electrode and the transparent substrate, light emitted from the transparent electrode results in higher efficiency of light output to the exterior as the refractive index of the medium is lower.

Examples of the low refractive index layers include aerogel, porous silica, magnesium fluoride, and fluorine based polymers. Since the transparent substrate commonly has a refractive index of 1.5-about 1.7, the low refractive index layer preferably has a refractive index of at most 1.5, but more preferably has a refractive index of at most 1.35.

Further, the thickness of the low refractive index medium is preferably at least twice the wavelength in the medium. The reason is that when the thickness of the low refractive index medium approaches light wavelength, whereby electromagnetic wave oozed via evernescent enters the inside of the substrate, effects of the low refractive index layer are reduced.

A method to introduce the interface generating total reflection or to introduce a diffraction grating into any of the media has a feature exhibiting highly enhanced effects of improving the light-outputting efficiency. In this method, by utilizing properties of the diffraction grating in which it is possible to change the direction of light to a specified direction differing from diffraction via so-called Bragg diffraction, such as primary diffraction or secondary diffraction, light which is not capable of emitting outside because of total reflection at an interlayer among all the light emitted from the emission layer, is subjected to diffraction via introduction of the diffraction grating at any interlayer or in the medium (in the transparent substrate or in the transparent electrode), so that light is output to the exterior.

The introduced diffraction grating preferably has a two-dimensional periodic refractive index. The emission layer randomly emits light in all directions, and when a conventional one-dimensional diffraction grating exhibiting a periodic refractive index distribution only in a certain direction is employed, light directed to a specified direction is only diffracted, whereby the light-outputting efficiency is not so enhanced. However, light directed to all directions is diffracted by changing the refractive index distribution to a two-dimensional one to enhance the light-outputting efficiency.

The location of the diffraction grating to be introduced may be at any interlayer or in the medium (in a transparent substrate or in a transparent electrode) as described before, but preferred is a position adjacent to the organic emission layer where luminescence is generated.

At such time, the cycle of the diffraction grating is preferably about ½-about 3 times the wavelength of light in the medium.

With regard to the arrangement of the diffraction grating, it is preferable that a square lattice shape, a triangle lattice shape, a honeycomb shape or the like is two-dimensionally arranged and repeated.

<<Light Condensing Sheet>>

In an organic EL element of the present invention, luminance in the specified direction, for example, the front direction against the emission plane of the element can be enhanced via processing to form a structure of a micro-lens array or in combination with a so-called light condensing sheet on the light-outputting side of a substrate.

As an example of the micro-lens array, quadrangular pyramids 30 µm on a side and having a vertex angle of 90° are two-dimensionally arranged on the light-outputting side of the substrate. The side of the quadrangular pyramids is preferably 10-100 µm. When the length of the side is shorter than the above range, light is color-generated because of the effect of diffraction, and when the length is too large, it is not preferred that increasing of thickness results.

As a light condensing sheet, one applied practically for an LED backlight of a liquid crystal display device is usable. Examples of such the sheet include a brightness enhancing film (BEF) produced by Sumitomo 3M Limited. As the prism sheet shape, Δ-shaped stripes having a pitch of 50 µm with a vertex angle of 90° formed on a substrate, shapes of rounded vertex angle, shapes with a randomly changed pitch or other shapes may be allowed to be included.

In order to control an emission angle of a light-emitting element, a light diffusion plate or film may be used in combination with a light condensing sheet. For example, a diffusion film (light-up) produced by KIMOTO Co., Ltd. and so forth can be employed.

<<Method of Preparing Organic EL Element>>

As an example of the method of preparing an organic EL element of the present invention, described is a method of preparing an organic EL element composed of anode/hole injection layer/hole transport layer/emission layer/electron transport layer/electron injection layer/cathode.

An anode is initially prepared in such a manner that a thin film composed of desired electrode materials, such as anode materials, is formed on an appropriate substrate so as to produce a film thickness of at most 1 µm, but preferably a film thickness of 10-200 nm via evaporation, sputtering or such.

Subsequently, formed thereon is an organic compound thin film composed of a hole injection layer, a hole transport layer, an emission layer, an electron transport layer, an electron injection layer and a hole blocking layer.

Examples of the method of forming each of these layers include, as described above, an evaporation method and wet processes (such as a spin coating method, a casting method, an inkjet method, and a printing method), but in the present invention, particularly preferred are coating methods such as an evaporation method, a spin coating method, an inkjet method and a printing method to conduct film formation in view of easy preparation of a homogeneous film and inhibition of pin hole formation.

Usable examples of liquid media by which an organic EL material of the present invention is dissolved or dispersed include ketones such as methyl ethyl ketone, cyclohexanone and so forth; aliphatic acid esters such as ethyl acetate and so forth; halogenated hydrocarbons such as dichlorobenzene and so forth; aromatic hydrocarbons such as toluene, xylene, mesitylene, cyclohexylbenzene, and so forth; aliphatic hydrocarbons such as cyclohexane, decalin, dodecane and so forth; and organic solvents such as DMF, DMSO and so forth. Further, examples of dispersing methods include methods of conducting dispersion via ultrasonic waves, high shearing force dispersion and media dispersion.

After formation of these layers, a thin film composed of cathode materials is formed on the resulting layer so as to reach a film thickness of at most 1 µm but preferably in the range of 50-200 nm via evaporation, sputtering or such, and a cathode is subsequently provided to prepare an intended organic EL element.

Further, the above preparation order may be reversed, and preparation may also be conducted in the order of a cathode, an electron injection layer, an electron transport layer, an emission layer, a hole transport layer, a hole injection layer and an anode. When direct current voltage is applied to a multicolor display device obtained in such a way, a voltage of approximately 2-40 V is applied while the anode is employed at positive polarity, and the anode is employed at negative polarity, whereby it is possible to observe luminescence. Further, an alternating current voltage may also be applied. In addition, waveform of the applied alternating current is not limited.

<<Application>>

An organic EL element of the present invention is usable as display devices, displays, and various luminescent sources. Examples of the luminescent sources include lighting devices such as home lighting devices and lighting devices in vehicles, backlights for clocks and liquid crystals, advertising boards, traffic lights, light sources for optical memory media, light sources for electrophotographic copiers, light sources for optical communication processors, and light sources for optical sensors, but the organic EL element is not limited thereto. Specifically, it is possible to be effectively applied as a backlight for liquid display devices, and lighting sources.

An organic EL device of the present invention may be subjected to patterning by using a metal mask or by an ink-jet printing method during film formation, if desired. When pattering is conducted, patterning may be conducted only for electrodes, may be conducted for electrodes together with an emission layer or may be conducted for the entire layers of an element, and a commonly known method is usable for preparation of the element.

Luminescent color of an organic EL element and a compound of the present invention is determined by applying a value measured employing spectroradiometer CS-1000 (manufactured by Konica Minolta Sensing, Inc.) to the CIE trichromatic coordinate shown in FIG. 4.16 on page 108 of "Shinpen Shikisai Kagaku Handbook" (Coloring Science Handbook, New Edition) (edited by Nihon Shikisai Gakkai, published by Tokyo University Shuppan Kai).

In the case of an organic EL element of the present invention being a white element, white means that when front luminance at a viewing angle of 2° is determined via the above-described method, chromaticity in the CIE 1931 chromaticity system at 1,000 Cd/m$^2$ is in the range of X=0.33±0.07 and Y=0.33±0.1.

EXAMPLE

Next, the present invention will be explained referring to examples, but embodiments in the present invention are not limited thereto.

The structures of compounds employed in the examples are also shown below.

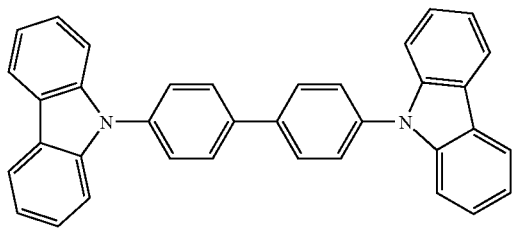

CBP

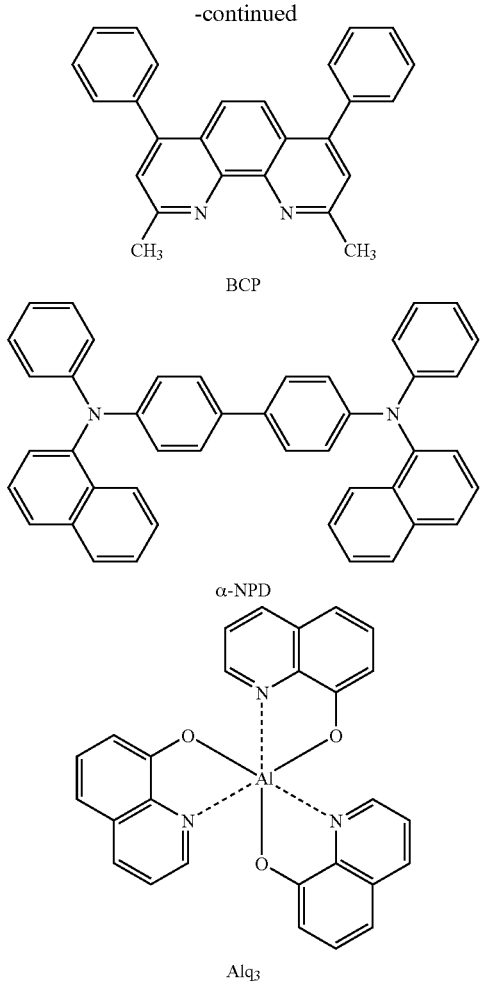

Example 1

<<Preparation of Organic Layer 1 Containing Reactive Organic Compound>>:
Comparative Example (Uniform Concentration)

As described below, an organic layer containing a reactive organic compound was prepared. Incidentally, organic EL elements of the present invention described in Example 2 as well as those after Example 2 were also prepared in accordance with preparation of the organic layer described in Example 1.

A glass substrate (NA45, produced by NH Techno Glass Corporation) was placed on a commercially available spin coater and spin-coated at 1000 rpm for 30 seconds employing a solution in which exemplified compound 4-8 (60 mg) was dissolved in 10 ml of 1,2-dichloroethane, and the resulting was dried at 25° C. for one hour to prepare organic layer 1 containing exemplified compound 4-8 as a reactive organic compound on the glass substrate.

<<Preparation of Organic Layer 2 Containing Reactive Organic Compound>>: The Present Invention (Nonuniform Concentration)

Organic layer 1 obtained above was exposed to UV light for 30 seconds to prepare organic layer 2 containing a reactive organic compound.

<<Analysis of Concentration Distribution of Exemplified Compound 4-8 in Organic Layer>>

The concentration distribution of exemplified compound 4-8 in an organic layer was determined with a method by which a distribution of vinyl groups in exemplified compound 4-8 was measured. The distribution of double bonds in the vinyl groups was determined by the following means.

In order to acquire the analyzed area, cutting at an angle was carried out with SAICAS NN04 type produced by Daipla Wintes Co., Ltd. cutting was conducted at a magnification of 500 times to obtain the analyzed area having a width of 20 μm. Subsequently, with respect to this cut surface, double bonds remaining in a thin film were labeled by a bromine addition method. As to a sample after labeling, an element composition distribution of the cut surface was measured with an ESCA Quantera SXM, manufactured by Ulvac-phi, Inc. to obtain the element composition distribution of the cut surface.

It is confirmed via measurement that organic layer 2 of the present invention has a concentration distribution in such a manner that concerning concentration in the depth direction of reactive organic compound 4-8 to be varied, organic layer 2 has an atomic concentration of 0% on the surface of organic layer 2, has an atomic concentration of 62% in the middle portion of organic layer 2, and has an atomic concentration of 97% in the lower layer portion of organic layer 2, whereas atomic concentration (%) in the depth direction of reactive organic compound 4-8 is approximately unchanged in such a manner that organic layer 1 has an atomic concentration of 95% on the surface of organic layer 1, has an atomic concentration of 97% in the middle portion of organic layer 1, and has an atomic concentration of 99% in the lower layer portion of organic layer 1.

Example 2

<<Preparation of Organic EL Element 1-1>>: Comparative Example

A substrate (NA45, produced by NH Techno Glass Corp.), prepared by forming a 100 nm thick ITO (indium tin oxide) film as an anode on a glass plate having a size of 100×100×1.1 mm, was subjected to patterning, and a transparent support substrate provided with this ITO transparent electrode was cleaned with isopropyl alcohol via ultrasonic waves, followed by being dried employing dry nitrogen gas and being cleaned for 5 minutes employing UV ozone.

This substrate was placed on a commercially available spin coater to conduct spin coating (film thickness of about 40 nm) at 1,000 rpm for 30 seconds, employing a solution in which 60 mg of PVK was dissolved in 10 ml of 1,2-dichloroethane, and vacuum-drying was carried out at 60° C. for one hour to form a hole transport layer.

Next, spin coating (film thickness of about 60 nm) was conducted at 1,000 rpm for 30 seconds, employing a solution in which 60 mg of CBP and 3.0 mg of Ir-1 were dissolved in 6 ml of toluene, the resulting was exposed to UV light for 30 seconds, and vacuum-drying was carried out at 60° C. for one hour to form an emission layer.

Further, this substrate was fixed on a substrate holder in a vacuum evaporator. On the other hand, 200 mg of basocuproin (BCP) were charged in a molybdenum resistance heating boat, and 200 mg of $Alq_3$ were charged in another molybdenum resistance heating boat to be installed in the vacuum evaporator. After reducing the vacuum tank pressure to $4×10^{-4}$ Pa, the foregoing heating boat in which BCP was charged was heated via electricity application, and evaporation was carried out on the foregoing emission layer at an evaporation rate of 0.1 nm/sec to form a hole blocking layer having a film thickness of 10 nm. An electron transport layer having a film thickness of 40 nm was further provide thereon after the foregoing heating boat in which $Alq_3$ was charged was heated via electricity application, and evaporation was conducted on the foregoing electron transport layer at an evaporation rate of 0.1 nm/sec. In addition, the substrate temperature during evaporation was room temperature. Subsequently, a cathode was formed via evaporation of 0.5 nm thick lithium fluoride and 110 nm thick aluminum to prepare organic EL element 1-1.

<<Preparation of Organic EL Element 1-2>>: The Present Invention

A substrate (NA45, produced by NH Techno Glass Corp.), prepared by forming a 100 nm thick ITO (indium tin oxide) film as an anode on a glass plate having a size of 100×100×1.1 mm, was subjected to patterning, and a transparent support substrate provided with this ITO transparent electrode was cleaned with isopropyl alcohol via ultrasonic waves, followed by being dried employing dry nitrogen gas and being cleaned for 5 minutes employing UV ozone.

This substrate was placed on a commercially available spin coater to conduct spin coating (film thickness of about 40 nm) at 1,000 rpm for 30 seconds, employing a solution in which 60 mg of exemplified compound 4-7 was dissolved in 10 ml of 1,2-dichloroethane, and the resulting was exposed to UV light for 30 seconds, followed by vacuum-drying at 60° C. for one hour to form a hole transport layer.

Next, spin coating (film thickness of about 60 nm) was conducted at 1,000 rpm for 30 seconds, employing a solution in which 60 mg of exemplified compound 1-1 and 3.0 mg of Ir-1 were dissolved in 6 ml of toluene, and vacuum-drying was carried out at 60° C. for one hour to form an emission layer.

Further, this substrate was fixed on a substrate holder in a vacuum evaporator, and installed in the vacuum evaporator. On the other hand, 200 mg of basocuproin (BCP) were charged in a molybdenum resistance heating boat, and 200 mg of $Alq_3$ were charged in another molybdenum resistance heating boat. After reducing the vacuum tank pressure to $4\times10^{-4}$ Pa, the foregoing heating boat in which BCP was charged was heated via electricity application, and evaporation was carried out on the foregoing emission layer at an evaporation rate of 0.1 nm/sec to form a hole blocking layer having a film thickness of 10 nm. An electron transport layer having a film thickness of 40 nm was further provide thereon after the foregoing heating boat in which $Alq_3$ was charged was heated via electricity application, and evaporation was conducted on the foregoing electron transport layer at an evaporation rate of 0.1 nm/sec. In addition, the substrate temperature during evaporation was room temperature. Subsequently, a cathode was formed via evaporation of 0.5 nm thick lithium fluoride and 110 nm thick aluminum to prepare organic EL element 1-2.

<<Preparation of Organic EL Elements 1-3-1-5>>: The Present Invention

Organic EL elements 1-3-1-5 were prepared similarly to preparation of organic EL element 1-2, except that exemplified compound 1-1 and Ir-1 were replaced by those shown in Table 1.

<<Evaluation of Organic EL Elements 1-1-1-5>>

The externally output quantum efficiency and lifetime of the resulting organic EL elements 1-1-1-5 each were evaluated.

(Externally Output Quantum Efficiency)

The externally output quantum efficiency (%) of the resulting organic EL element during application of a constant current of 2.5 $mA/cm^2$ under dried nitrogen atmosphere was measured. In addition, a spectrum radiation luminance meter CS-1000, manufactured by Konica Minolta Sensing, Inc., was used for the measurement.

The measured results of the externally output quantum efficiency shown in Table 1 are represented by the relative value when the measured value of organic EL element 1-1 was set to 100.

(Lifetime)

Time necessary for reducing luminance to half of the luminance immediately after emission at the initial time (initial luminance) was measured when driving with a constant current of 2.5 $mA/cm^2$, and was designated as a measure of half-lifetime (τ0.5). In addition, the spectrum radiation luminance meter CS-1000, manufactured by Konica Minolta Sensing, Inc., was also employed for the measurement. The measured results of the lifetime shown in Table 1 are represented by the relative value when the measured value of organic EL element 1-1 was set to 100. The obtained results are shown in Table 1.

TABLE 1

| Organic EL element | Compound | | Externally output quantum efficiency | Lifetime | Remarks |
|---|---|---|---|---|---|
| 1-1 | CBP | Ir-1 | 100 | 100 | Comparative example |
| 1-2 | 1-1 | Ir-1 | 115 | 210 | Present invention |
| 1-3 | 1-1 | 2-1 | 122 | 320 | Present invention |
| 1-4 | 1-2 | Ir-1 | 118 | 234 | Present invention |
| 1-5 | 1-2 | 2-1 | 120 | 352 | Present invention |

As is clear from Table 1, it is to be understood that organic EL elements of the present invention have exhibited high externally output quantum efficiency and long lifetime.

Example 3

<<Preparation of Organic EL Elements 2-1-2-5>>

Organic EL element 2-1 was prepared similarly to preparation of organic EL element 1-1 in Example 2, except that Ir-1 employed for preparation of an emission layer was replaced by Ir-9. Further, organic EL elements 2-2-2-5 each were prepared similarly to preparation of organic EL element 1-2, except that exemplified compound 1-1 and Ir-1 were replaced by those shown in Table 2, and evaluation was similarly made employing the method described in Example 1. The obtained results are shown in Table 2.

TABLE 2

| Organic EL element | Compound | | Externally output quantum efficiency | Lifetime | Remarks |
|---|---|---|---|---|---|
| 2-1 | CBP | Ir-9 | 100 | 100 | Comparative example |
| 2-2 | 1-1 | Ir-9 | 108 | 223 | Present invention |
| 2-3 | 1-1 | 2-5 | 110 | 340 | Present invention |
| 2-4 | 1-2 | Ir-9 | 111 | 242 | Present invention |
| 2-5 | 1-2 | 2-5 | 113 | 362 | Present invention |

As is clear from Table 2, it is to be understood that organic EL elements of the present invention have exhibited high externally output quantum efficiency and long lifetime.

Example 4

<<Preparation of Organic EL Elements 3-1-3-5>>

Organic EL element 3-1 was prepared similarly to preparation of organic EL element 1-1 in Example 2, except that Ir-1 employed for preparation of an emission layer was replaced by Ir-12. Further, organic EL elements 3-2-3-5 each were prepared similarly to preparation of organic EL element 1-2, except that exemplified compound 1-1 and Ir-1 were replaced by those shown in Table 3, and evaluation was similarly made employing the method described in Example 2. The obtained results are shown in Table 3.

TABLE 3

| Organic EL element | Compound | | Externally output quantum efficiency | Lifetime | Remarks |
|---|---|---|---|---|---|
| 3-1 | CBP | Ir-12 | 100 | 100 | Comparative example |
| 3-2 | 1-1 | Ir-12 | 103 | 182 | Present invention |
| 3-3 | 1-1 | 2-9 | 108 | 289 | Present invention |
| 3-4 | 1-2 | Ir-12 | 105 | 223 | Present invention |
| 3-5 | 1-2 | 2-9 | 108 | 343 | Present invention |

As is clear from Table 3, it is to be understood that organic EL elements of the present invention have exhibited high externally output quantum efficiency and long lifetime.

Example 5

<<Preparation of Organic EL Element 4-1>>

A substrate (NA45, produced by NH Techno Glass Corp.), prepared by forming a 100 nm thick ITO (indium tin oxide) film as an anode on a glass plate having a size of 100×100×1.1 mm, was subjected to patterning, and a transparent support substrate provided with this ITO transparent electrode was cleaned with isopropyl alcohol via ultrasonic waves, followed by being dried employing dry nitrogen gas and being cleaned for 5 minutes employing UV ozone.

This substrate was placed on a commercially available spin coater to conduct spin coating (film thickness of about 40 nm) at 1,000 rpm for 30 seconds, employing a solution in which 60 mg of exemplified compound 4-1 was dissolved in 10 ml of toluene, and the resulting was exposed to UV light for 30 seconds, followed by vacuum-drying at 60° C. for one hour to form a hole transport layer.

Next, spin coating (film thickness of about 60 nm) was conducted at 1,000 rpm for 30 seconds, employing a solution in which 60 mg of exemplified compound 1-2 and 3.0 mg of exemplified compound 2-7 were dissolved in 6 ml of toluene, the resulting was exposed to UV light for 30 seconds, and vacuum-drying was subsequently carried out at 60° C. for one hour to form an emission layer.

Further, spin coating (film thickness of about 10 nm) was conducted at 1,000 rpm for 30 seconds, employing a solution in which 20 mg of exemplified compound 3-1 was dissolved in 10 ml of toluene, the resulting was exposed to UV light for 30 seconds, and vacuum-drying was subsequently carried out at 60° C. for one hour to form a hole blocking layer.

This substrate was fixed on a substrate holder in a vacuum evaporator, and 200 mg of Alq$_3$ were charged in a molybdenum resistance heating boat to be installed in the vacuum evaporator. After reducing the vacuum tank pressure to $4×10^{-4}$ Pa, the foregoing heating boat in which Alq$_a$ was charged was heated by turning on electricity, and evaporation was carried out on the foregoing electron transport layer at an evaporation rate of 0.1 nm/sec to further form an electron transport layer having a film thickness of 40 nm. In addition, the substrate temperature during evaporation was room temperature.

Subsequently obtained were 0.5 nm thick Lithium fluorine and 110 nm thick aluminum via evaporation to form a cathode, and organic EL element 4-1 was prepared.

Blue light luminescence was able to be confirmed by driving this element with a constant current of 2000 cd/m$^2$.

Luminescence was also confirmed in cases where exemplified compound 4-1 was replaced by exemplified compound 4-7 or 4-10, exemplified compound 1-2 was replaced by exemplified compound 1-3 or 1-5, exemplified compound 2-7 was replaced by exemplified compound 2-2 or 2-6, and exemplified compound 3-1 was replaced by exemplified compound 3-6 or 3-9.

By way of comparison, exemplified compound 4-1 was replaced by α-NPD, exemplified compound 1-2 was replaced by CBP, exemplified compound 2-7 was replaced by Ir-1, and exemplified compound 3-1 was replaced by BCP to try to prepare an organic EL element, but the organic EL element was unable to be formed.

Example 6

<<Preparation of Organic EL Full Color Display Device>>

FIG. 1 (a)-FIG. 1(e) each show a schematic diagram of an organic EL full color display device. After a substrate (NA45, produced by NH Techno Glass Corp.), prepared by forming 100 nm thick transparent ITO electrode 102 as an anode on glass plate 101, was subjected to patterning in a pitch of 100 μm, partition walls 103 made of nonphotosensitive polyimide (each having a width of 20 μm and a thickness of 2.0 μm) were formed between transparent ITO electrodes on this glass substrate via photolithography. The following hole injection layer composition was injected between partition walls made of polyimide on the ITO electrode employing an inkjet head (MJ800C, manufactured by Seiko Epson Corporation), exposed to UV light for 30 seconds, and subjected to a drying treatment at 60° C. for 10 minutes to prepare hole injection layer 104 having a thickness of 40 nm.

Each of the following blue emission layer composition, green emission layer composition and red emission layer composition was similarly injected onto this hole injection layer employing an inkjet head, the resulting was exposed to UV light for 30 seconds, followed by a drying treatment at 60° C. for 10 minutes to form emission layers 105B, 105G and 105R, respectively. Al 106 was vacuum-evaporated as a cathode so as to cover these emission layers to prepare an organic EL element.

It was understood that the resulting organic EL element generated luminescence of each of blue, green and red via application of voltage to each of electrodes, and was utilized as a full color display device.

(Hole Injection Layer Composition)

| | |
|---|---|
| Compound 4-8 | 20 parts by weight |
| Cyclohexyl benzene | 50 parts by weight |
| Isopropyl biphenyl | 50 parts by weight |

(Blue Emission Layer Composition)

| Compound 1-2 | 0.7 parts by weight |
| Ir-12 | 0.04 parts by weight |
| Cyclohexyl benzene | 50 parts by weight |
| Isopropyl biphenyl | 50 parts by weight |

(Green Emission Layer Composition)

| Compound 1-2 | 0.7 parts by weight |
| Ir-1 | 0.04 parts by weight |
| Cyclohexyl benzene | 50 parts by weight |
| Isopropyl biphenyl | 50 parts by weight |

(Red Emission Layer Composition)

| Compound 1-2 | 0.7 parts by weight |
| Ir-9 | 0.04 parts by weight |
| Cyclohexyl benzene | 50 parts by weight |
| Isopropyl biphenyl | 50 parts by weight |

Further, it was understood that organic EL elements, in which Ir-1, Ir-12 and Ir-9 were replaced by any of compounds 2-1-2-10, and compound 1-2 was replaced by any of compound 1-1 and compounds 1-3-1-10, were similarly possible to be utilized as a full color display device.

Example 7

<<Preparation of Organic EL Element 5-1>>White Light-emitting Organic EL Element A substrate (NA45, produced by NH Techno Glass Corp.), prepared by forming a 100 nm thick ITO (indium tin oxide) film as an anode on a glass plate having a size of 100×100×1.1 mm, was subjected to patterning, and a transparent support substrate provided with this ITO transparent electrode was cleaned with isopropyl alcohol via ultrasonic waves, followed by being dried employing dry nitrogen gas and being cleaned for 5 minutes employing UV ozone. This substrate was placed on a commercially available spin coater to conduct spin coating (film thickness of about 40 nm) at 1,000 rpm for 30 seconds, employing a solution in which 60 mg of exemplified compound 4-8 was dissolved in 10 ml of toluene, and the resulting was exposed to UV light for 30 seconds, followed by vacuum-drying at 60° C. for one hour to form a hole transport layer.

Next, spin coating (film thickness of about 40 nm) was conducted at 1,000 rpm for 30 seconds, employing a solution in which 60 mg of exemplified compound 1-2 and 3.0 mg of exemplified compound 2-5 and 3.0 mg of exemplified compound 2-7 were dissolved in 6 ml of toluene, the resulting was exposed to UV light for 30 seconds, and vacuum-drying was subsequently carried out at 60° C. for one hour to form an emission layer.

Further, spin coating (film thickness of about 10 nm) was conducted at 1,000 rpm for 30 seconds, employing a solution in which 20 mg of exemplified compound 3-1 was dissolved in 6 ml of toluene, the resulting was exposed to UV light for 30 seconds, and vacuum-drying was subsequently carried out at 60° C. for one hour to form a hole blocking layer.

Subsequently, this substrate was fixed on a substrate holder in a vacuum evaporator, and 200 mg of $Alq_3$ were charged in a molybdenum resistance heating boat to be installed in the vacuum evaporator. After reducing the vacuum tank pressure to $4\times10^{-4}$ Pa, the foregoing heating boat in which $Alq_3$ was charged was heated via electricity application, and evaporation was carried out on the foregoing electron transport layer at an evaporation rate of 0.1 nm/sec to further form an electron transport layer having a film thickness of 40 nm. In addition, the substrate temperature during evaporation was room temperature.

Subsequently obtained were 0.5 nm thick Lithium fluorine and 110 nm thick aluminum via evaporation to form a cathode, and organic EL element 5-1 was prepared.

When electricity was applied to this element, white light was obtained, whereby it was confirmed that this was utilized as a lighting device. In addition, it was understood that white luminescence was similarly obtained even in the case of those replaced by other exemplified compounds.

The invention claimed is:

1. An organic electroluminescent element comprising a support substrate provided thereon an anode and a cathode, the organic electroluminescent element comprising an organic layer containing a reactive organic compound between the anode and the cathode,
   wherein the reactive organic compound contained in the organic layer has nonuniform concentration at any point in time between termination of a process of preparing the organic electroluminescent element and a start of electricity application to the organic electroluminescent element, the reactive organic compound comprising one of partial structures represented by the following formulae:

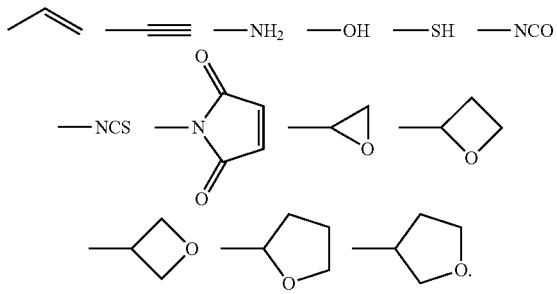

2. The organic electroluminescent element of claim 1, wherein the reactive organic compound contained between one surface of the organic layer and the other surface of the organic layer has a concentration gradient.

3. The organic electroluminescent element of claim 1, wherein the reactive organic compound existing around a joint surface between the organic layer and a layer immediately below the organic layer has a larger amount than that of the reactive organic compound existing around another joint surface between the organic layer and another layer immediately above the organic layer.

4. The organic electroluminescent element of claim 1, wherein either A1 obtained by dividing absolute value |A−B| by A or B1 obtained by dividing absolute value |A−B| by B is at least 5%, where A is an amount of the reactive organic compound existing near one surface of the organic layer, and B is an amount of the reactive organic compound existing near the other surface of the organic layer.

5. The organic electroluminescent element of claim 4, wherein either A1 obtained by dividing absolute value |A−B| by A or B1 obtained by dividing absolute value |A−B| by B is at least 10%.

6. The organic electroluminescent element of claim 1, wherein a method of manufacturing the organic electroluminescent element comprises a coating process.

7. The organic electroluminescent element of claim 6, comprising two layers coated in series via the coating process.

8. The organic electroluminescent element of claim 6, comprising at least three layers coated in series via the coating process.

9. The organic electroluminescent element of claim 1, wherein the organic layer comprises a phosphorescence emitting dopant.

10. A method of manufacturing the organic electroluminescent element of claim 1, comprising the step of:
preparing at least one organic layer with a coating process.

11. A lighting device comprising the organic electroluminescent element of claim 1.

12. A display device comprising the organic electroluminescent element of claim 1.

* * * * *